(12) United States Patent
Yoon et al.

(10) Patent No.: US 10,671,529 B2
(45) Date of Patent: Jun. 2, 2020

(54) ADDRESS SCHEDULING METHODS FOR NON-VOLATILE MEMORY DEVICES WITH THREE-DIMENSIONAL MEMORY CELL ARRAYS

(71) Applicant: Samsung Electronics Co., Ltd., Suwon-si, Gyeonggi-do (KR)

(72) Inventors: Chi Weon Yoon, Seoul (KR); Dong Hyuk Chae, Seoul (KR); Sang-Wan Nam, Hwaseong-si (KR); Jung-Yun Yun, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 85 days.

(21) Appl. No.: 15/790,583

(22) Filed: Oct. 23, 2017

(65) Prior Publication Data

US 2018/0046574 A1 Feb. 15, 2018

Related U.S. Application Data

(63) Continuation-in-part of application No. 14/837,857, filed on Aug. 27, 2015, now Pat. No. 9,798,659, (Continued)

(30) Foreign Application Priority Data

Aug. 20, 2010 (KR) .......................... 10-2010-0080964

(51) Int. Cl.
*G06F 12/06* (2006.01)
*G11C 5/02* (2006.01)
(Continued)

(52) U.S. Cl.
CPC ........ *G06F 12/0646* (2013.01); *G06F 3/0619* (2013.01); *G06F 3/0653* (2013.01);
(Continued)

(58) Field of Classification Search
CPC .................................................. G11C 11/5621
See application file for complete search history.

(56) References Cited

U.S. PATENT DOCUMENTS 7,212,436 B2   5/2007  Li
7,623,375 B2   11/2009 Kim et al.
(Continued)

FOREIGN PATENT DOCUMENTS

JP   2008-103429 A   5/2008
JP   2008532199 A    8/2008
(Continued)

OTHER PUBLICATIONS

U.S. Office Action dated Sep. 11, 2015 for corresponding U.S. Appl. No. 13/213,806.
Office Action for Corresponding Korea Patent Application No. 10-2010-0080964 dated May 22, 2016.
(Continued)

*Primary Examiner* — Gary W. Cygiel
(74) *Attorney, Agent, or Firm* — Harness, Dickey & Pierce, P.L.C.

(57) ABSTRACT

At least one address scheduling method includes selecting a first bit line, selecting a first string connected to the first bit line, performing address scheduling on N pages of each of multi-level cells in the first string sequentially from a bottom word line to a top word line, and after completing the address scheduling on all word lines in the first string, performing address scheduling on second to k-th strings sequentially in the same manner as performed with respect to the first string, where "k" is 2 or a natural number greater than 2.

12 Claims, 21 Drawing Sheets

Related U.S. Application Data which is a continuation of application No. 13/213,806, filed on Aug. 19, 2011, now abandoned.

(51) Int. Cl.
*G11C 16/04* (2006.01)
*G11C 11/56* (2006.01)
*G11C 8/10* (2006.01)
*G06F 3/06* (2006.01)
*G11C 16/08* (2006.01)
*G11C 16/24* (2006.01)

(52) U.S. Cl.
CPC ............ *G06F 3/0679* (2013.01); *G11C 5/025* (2013.01); *G11C 8/10* (2013.01); *G11C 11/5628* (2013.01); *G11C 11/5642* (2013.01); *G11C 16/0483* (2013.01); *G11C 16/08* (2013.01); *G11C 16/24* (2013.01); *G06F 2212/2022* (2013.01); *G11C 2211/5648* (2013.01)

(56) References Cited

U.S. PATENT DOCUMENTS

| | | |
|---|---|---|
| 8,514,625 B2 | 8/2013 | Shim et al. |
| 8,767,473 B2 | 7/2014 | Shim et al. |
| 2006/0193176 A1 | 8/2006 | Li |
| 2008/0212367 A1 | 9/2008 | Kim et al. |
| 2008/0310230 A1 | 12/2008 | Kim et al. |
| 2010/0097859 A1 | 4/2010 | Shim et al. |
| 2010/0125695 A1 | 5/2010 | Wu et al. |
| 2010/0181615 A1 | 7/2010 | Ikebuchi |
| 2011/0024816 A1 | 2/2011 | Moon et al. |

FOREIGN PATENT DOCUMENTS

| | | |
|---|---|---|
| JP | 2010040109 A | 2/2010 |
| KR | 100904352 | 11/2007 |
| KR | 100816154 B1 | 3/2008 |
| KR | 2008-0109335 A | 12/2008 |

OTHER PUBLICATIONS

Office Action for Corresponding Korean Patent Application No. 10-2010-0080964 dated Apr. 26, 2017.

ADDRESS SCHEDULING METHODS FOR NON-VOLATILE MEMORY DEVICES WITH THREE-DIMENSIONAL MEMORY CELL ARRAYS

CROSS-REFERENCE TO RELATED APPLICATION

This application is a continuation-in-part of U.S. application Ser. No. 14/837,857, filed on Aug. 27, 2015, which is a continuation of U.S. application Ser. No. 13/213,806, filed on Aug. 19, 2011, which claims priority under 35 U.S.C. § 119(a) to Korean Patent Application No. 10-2010-0080964, filed on Aug. 20, 2010, in the Korean Intellectual Patent Office (KIPO), the entire contents of each of which is incorporated herein by reference.

BACKGROUND

Example embodiments relate to address scheduling methods for three-dimensional (3D) memory cell arrays, and more particularly, to address scheduling methods for 3D memory cell arrays in non-volatile memory devices including a plurality of multi-level cells.

Flash memory used as electrically erasable programmable read-only memory (EEPROM) may have an advantage of random access memory (RAM) in which data can be readily programmed and erased and an advantage of ROM in which data can be retained without supply of power.

Flash memory is usually divided into NAND flash memory and NOR flash memory. NOR flash memory may have a structure in which memory cells are independently connected to a bit line and a word line, thereby having an excellent random access time characteristic. On the other hand, NAND flash memory may be improved in terms of the degree of integration because of its structure in which a plurality of memory cells may be connected to one another, thereby requiring only one contact per cell string. Accordingly, the NAND structure is usually used in highly integrated flash memory.

Multi-bit cells which may be capable of storing plural data in a single memory cell. This type of a memory cell is generally called a multi-level cell (MLC). On the other hand, a memory cell capable of storing a single bit is called a single level cell (SLC).

There may occur a coupling effect between memory cells connected to adjacent word lines when a program operation is performed according to conventional address scheduling methods. To compensate for the coupling effect, a program bias voltage may be applied to two adjacent word lines alternately when a 2-bit MLC is programmed. These address scheduling methods, however, may deteriorate device operating speed.

SUMMARY

At least one example embodiment of the inventive concepts may provide address scheduling methods for increasing the operating performance of three-dimensional (3D) memory cell arrays.

According to at least one example embodiment of the inventive concepts, there is provided an address scheduling method of a three dimensional nonvolatile memory device including a plurality of cell strings, each of the plurality of cell strings including a plurality of nonvolatile memory cells belonging to a first sub-block and a plurality of nonvolatile memory cells belonging to a second sub-block, each of the plurality of nonvolatile memory cells being a multi-bit memory cell that is configured to store N-bit data, where "N" is a natural number greater than or equal to 2. The method includes selecting a first bit line connected to first through k-th strings, where "k" is a natural number greater than or equal to 2; selecting the first string coupled to the first bit line; performing addressing scheduling on the memory cells connected to each word line sequentially in order from a bottom word line to a top word line belonging to the first sub-block of the first string; and performing addressing scheduling on the memory cells to be connected to each word line sequentially in order from a bottom word line to a top word line belonging to the second sub-block of the first string.

The method may further include selecting a second string coupled to the first bit line; performing addressing scheduling on the memory cells connected to each word line sequentially in order from a bottom word line to a top word line belonging to the first sub-block of the second string; and performing addressing scheduling on the memory cells to be connected to each word line sequentially in order from a bottom word line to a top word line belonging to the second sub-block of the second string.

According to at least one example embodiment, there is provided an address scheduling method of a three dimensional nonvolatile memory device including a plurality of cell strings, each of the plurality of cell strings including a plurality of nonvolatile memory cells belonging to a first sub-block and a plurality of nonvolatile memory cells belonging to a second sub-block, each of the plurality of nonvolatile memory cells being a multi-bit memory cell that is configured to store N-bit data, where "N" is a natural number greater than or equal to 2. The method includes selecting a first bit line connected to first through k-th strings, where "k" is a natural number greater than or equal to 2; performing addressing scheduling on the memory cells connected to the first word line of the first sub-block sequentially in order from the first string connected to the k-th string; performing addressing scheduling on the memory cells connected to a second word line adjacent to the first word line of the first sub-block sequentially in order from the first string connected to the k-th string; and after performing address scheduling for the last word line of the first sub-block in order from the first string connected to the k-th string, performing addressing scheduling on the memory cells connected to the first word line of the second sub-block in order from the first string connected to the k-th string.

According to at least one example embodiment, there is provided a method of programming a three dimensional nonvolatile memory device including a plurality of nonvolatile memory cells arranged in a plurality of cell strings, each of the plurality of nonvolatile memory cells being a multi-bit memory cell that is configured to store N-bit data, where "N" is a natural number greater than or equal to 2. The method includes selecting a first bit line; selecting the first string coupled to the first bit line; performing a precharge operation on at least one string excluding the first string among the plurality of strings connected to the first bit line; and programming memory cells connected to each word line sequentially in order from a bottom word line to a top word line of the first string.

According to at least one example embodiment, there is provided a method of programming a three dimensional nonvolatile memory device including a plurality of nonvolatile memory cells arranged in a plurality of cell strings, each of the plurality of nonvolatile memory cells being a multi-bit memory cell that is configured to store N-bit data, where "N" is a natural number greater than or equal to 2. The method includes selecting a first bit line; programming memory cells connected to a first word line sequentially in order from the first string connected to the k-th string connected to the first bit line; and programming memory cells connected to a second word line adjacent to the first word line sequentially in order from the first string connected to the k-th string connected to the first bit line. The programming memory cells connected to the first word line may include selecting the first string; performing a precharge operation on at least one string excluding the first string among the plurality of strings connected to the first bit line; and programming memory cells coupled to the first string and coupled to the first word line.

BRIEF DESCRIPTION OF THE DRAWINGS

Example embodiments of the inventive concepts will be more clearly understood from the following brief description taken in conjunction with the accompanying drawings. FIGS. 1-11 represent non-limiting, example embodiments as described herein.

FIG. 1 is a block diagram illustrating non-volatile memory systems according to at least one example embodiment of the inventive concepts;

FIG. 2 is a circuit diagram illustrating a memory cell array of FIG. 1 in two dimensions;

FIG. 3 is a circuit diagram illustrating a memory cell array of FIG. 1 in three dimensions;

FIGS. 7-10 illustrate memory systems including the non-volatile memory device of FIG. 1 according to different example embodiments of the inventive concepts; and FIG. 11 is a block diagram illustrating data storage apparatuses including the memory system of FIG. 10.

Figure 1:
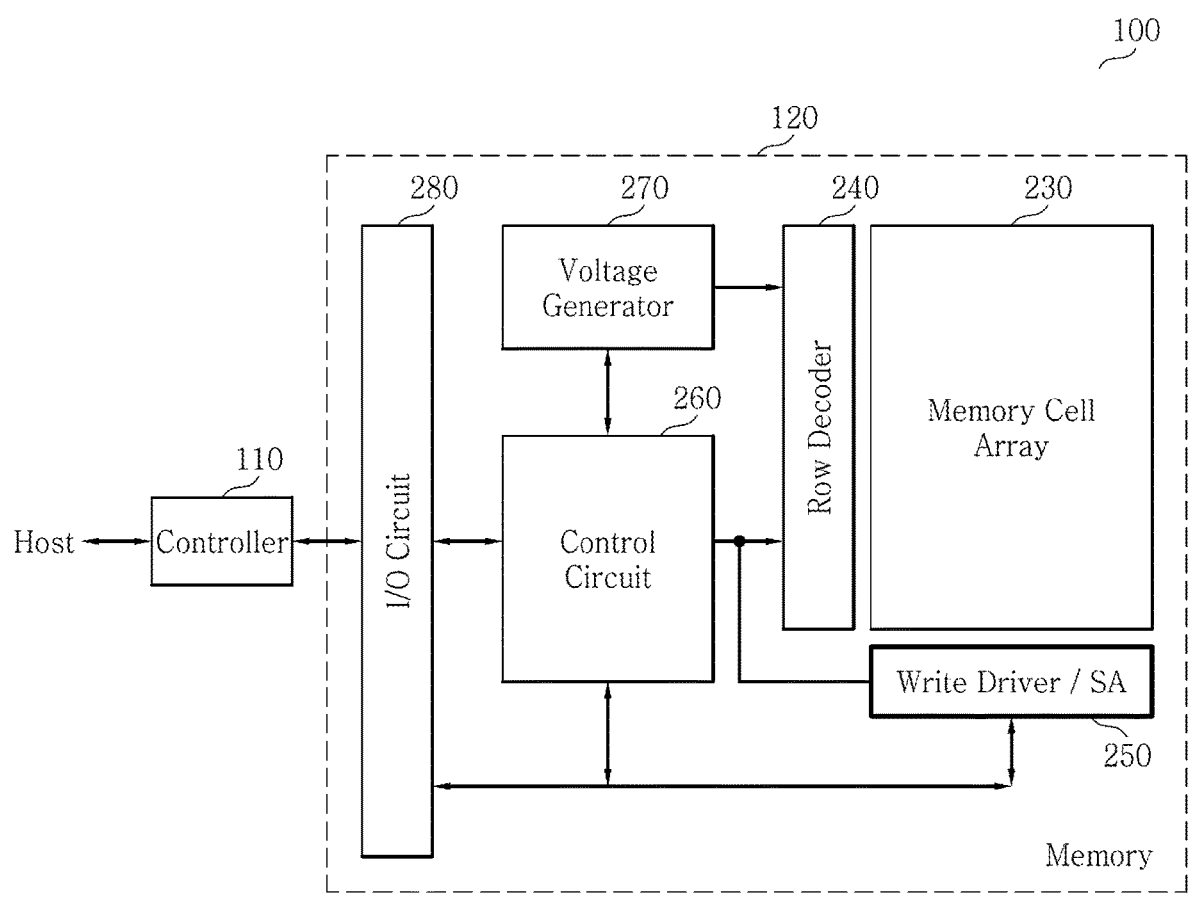

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating non-volatile memory systems 100 according to at least one example embodiment of the inventive concepts. A non-volatile memory system 100 may include a non-volatile memory device 120 and a memory controller 110 controlling the non-volatile memory device 120. The non-volatile memory device 120 may be a NOR flash memory and/or a NAND flash memory, but the example embodiments are not restricted thereto. The non-volatile memory device 120 may include a memory cell array 230, a row decoder 240, a write driver/sense amplifier (SA) circuit 250, a control circuit 260, a voltage generator 270 and an input/output (I/O) circuit 280.

The row decoder 240 may select one word line from among a plurality of word lines in response to a row address, may apply a first operating voltage to the selected word line and may apply a second operating voltage to unselected word lines. For instance, the row decoder 240 may apply the first operating voltage (e.g., a program voltage) to the selected word line and the second operating voltage (e.g., a pass voltage) to the unselected word lines in a program operation and may apply the first operating voltage (e.g., a read reference voltage) to the selected word line and the second operating voltage (e.g., a read voltage) to the unselected word lines in a read operation.

The write driver/SA circuit 250 may be selectively connected to a plurality of bit lines and may write and/or program data to a selected memory cell and/or may read data from the selected memory cell by sensing and amplifying the data. The write driver/SA circuit 250 may include a plurality of data storage units (not shown) to store data set to be programmed in the program operation and to store a data set read from memory cells in the read operation. Each of the data storage units may be implemented by a plurality of latches. The data storage units may also store a data set read in a program verify operation. A switching block (not shown) may be between the write driver/SA circuit 250 and the memory cell array 230 to selectively connect a write driver and/or a SA to the plurality of bit lines.

The control circuit 260 may output internal control signals (not shown) for controlling operations, such as program operations, erase operations, and read operations, of the non-volatile memory device 120 in response to an external command. The control circuit 260 may control address scheduling of the memory cell array 230. The address scheduling may include scheduling an address sequence. When multi-level cells (MLCs) capable of storing two bits include two pages in the memory cell array 230, the control circuit 260 may schedule an address sequence for the pages of the MLCs.

The voltage generator 270 may generate voltages, such as a program voltage, a pass voltage, and a read voltage, for the operations of the non-volatile memory device 120. The I/O circuit 280 may interface the non-volatile memory device 120 with the outside (e.g., the memory controller 110). The I/O circuit 280 may receive a command and/or data to be programmed from the outside and/or transmit a state signal and/or read data to the outside. The memory controller 110 may control overall data exchange between a host and the non-volatile memory device 120. For example, the memory controller 110 may control the non-volatile memory device 120 to write data and/or read data in compliance with the host.

Figure 2:
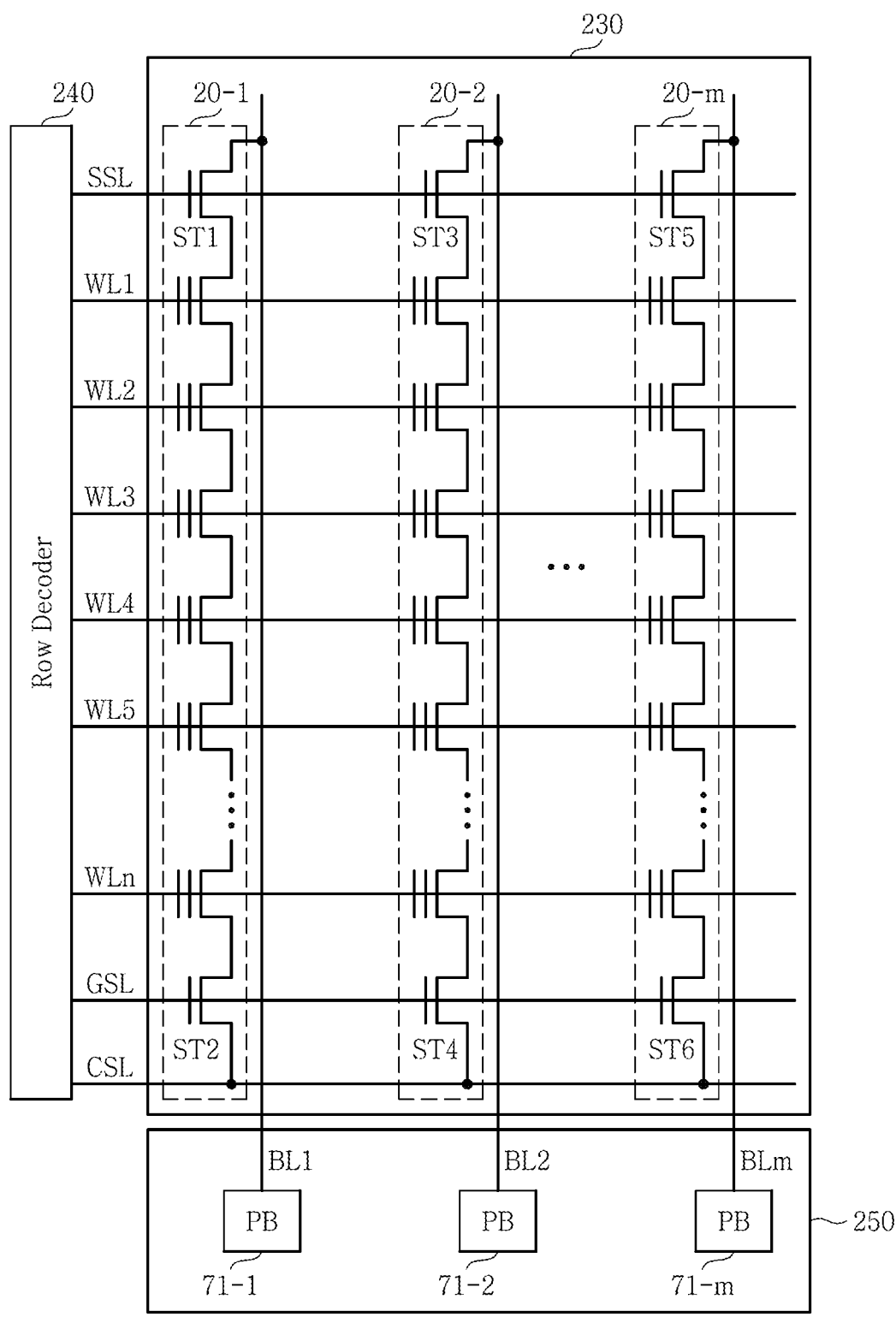
Figure 3:
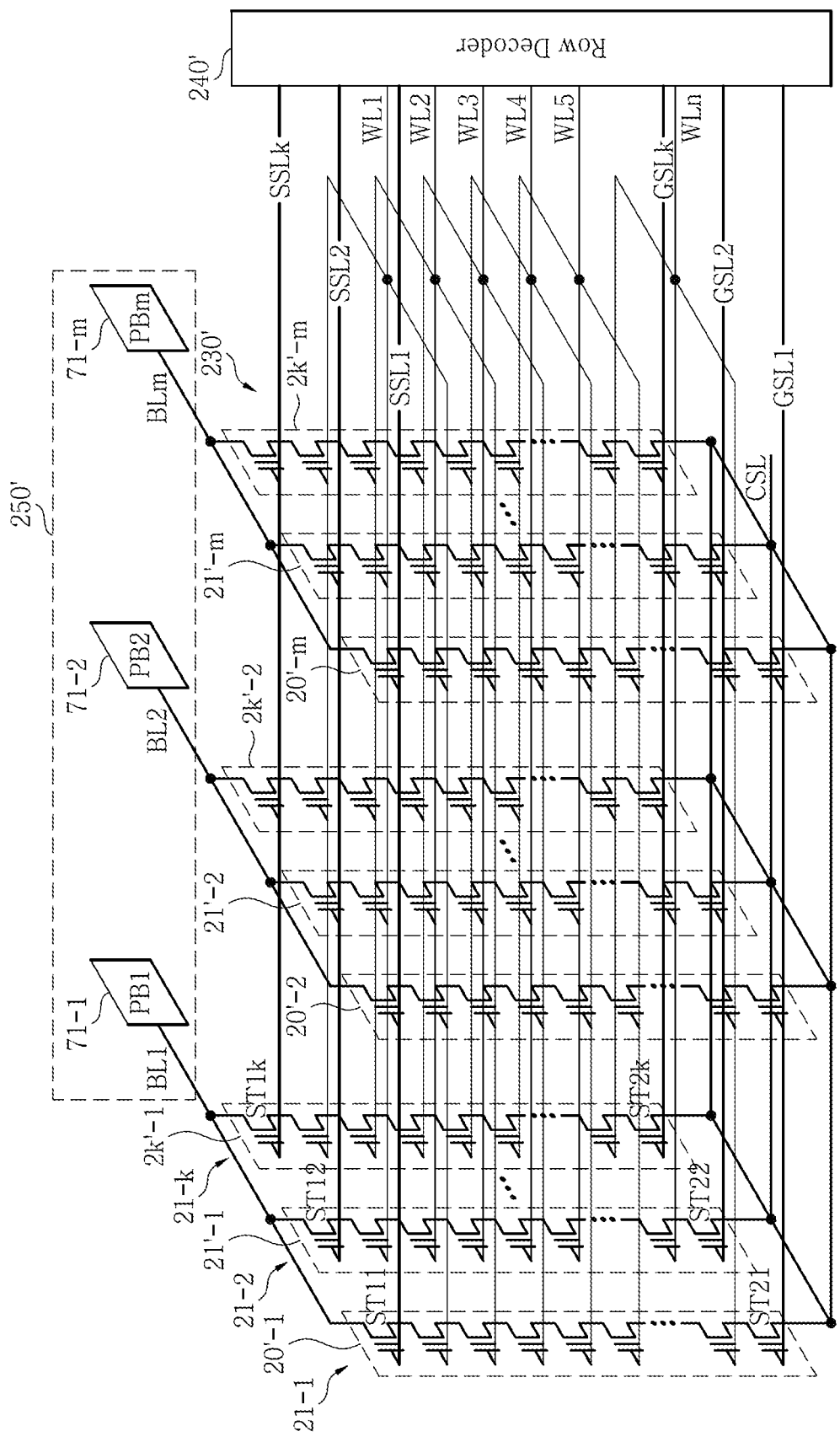

FIG. 2 is a circuit diagram illustrating a memory cell array 230 of FIG. 1 in two dimensions. FIG. 3 is a circuit diagram illustrating a memory cell array 230' as an example of a memory cell array 230 of FIG. 1 in three dimensions. Referring to FIG. 2, the memory cell array 230 may include a plurality of cell strings 20-1, 20-2, . . . , and 20-$m$ where "m" is a natural number. Each of the cell strings 20-1 through 20-$m$ may include a plurality of non-volatile memory cells. The cell strings 20-1 through 20-$m$ may be disposed in two dimensions on one plane in the memory cell array 230, as illustrated in FIG. 2, or cell strings 20'-1 through 2$k$'-m may be disposed in three dimensions on different planes and/or layers in a memory cell array 230', as illustrated in FIG. 3.

The cell string 20-1 illustrated in FIG. 2 may include a first selection transistor ST1 connected to a bit line BL1, a second selection transistor ST2 connected to ground, and a plurality of non-volatile memory cells connected in series between the first and second selection transistors ST1 and ST2. The cell string 20-2 may include a third selection transistor ST3 connected to a bit line BL2, a fourth selection transistor ST4 connected to the ground, and a plurality of non-volatile memory cells connected in series between the third and fourth selection transistors ST3 and ST4. The cell string 20-$m$ may include a fifth selection transistor ST5 connected to a bit line BLm, a sixth selection transistor ST6 connected to ground, and a plurality of non-volatile memory cells connected in series between the fifth and sixth selection transistors ST5 and ST6.

The non-volatile memory cells included in each of the cell strings 20-1 through 20-$m$ may be implemented by electrically erasable programmable read-only memory (EEPROM) cells that can store one or more bits. The non-volatile memory cells may be implemented by NAND flash memory cells (e.g., single level cells (SLCs) or MLCs) which can store one or more bits. The cell strings 20-1 through 20-$m$ may be referred to as NAND strings. String selection lines SSL may be connected to the selection transistors (e.g., ST1, ST2 and ST3). A common source line CSL may be connected to selection transistors (e.g., ST2, ST4 and ST6). Word lines WL1-WLn may be connected to the plurality of non-volatile memory cells. A page buffer PB (e.g., 71-1 through 71-m) may be connected to each bit line (e.g., BL1-BLm).

As used herein, letters representing a variable, for example a natural number, are not limited by a number corresponding to a position in the alphabet. Rather, letters representing a variable herein may be any number extending from a sequence (e.g., for 20-1, 20-2, . . . , and 20-m, "m" may be any natural number greater than 2). For example, the letters "m" and "k" representing natural numbers, as used herein, may be variables representing any natural number. Further, combinations of letters and numbers are not constrained to a specific range. For example, $2k'$ of $2k'$-m is not limited to ten digits and expresses a variable that may be of any magnitude. The specific labeling herein using variables, and variable-number combinations, is for purposes of explanation only and a number of cells, cell strings, cells per cell string, layers and other features of example embodiments may differ due to, for example, an application of example embodiments.

Referring to FIG. 3, each of a plurality of layers 21-1, 21-2, . . . , 21-k (where "k" is a natural number) may include a plurality of cell strings. The first layer 21-1 may include a plurality of cell strings 20'-1 through 20'-m, the second layer 21-2 may include a plurality of cell strings 21'-1 through 21'-m, and the k-th layer 21-k may include a plurality of cell strings $2k'$-1 through $2k'$-m. As illustrated in FIG. 3, a first cell string 20'-1 may be disposed in the first layer 21-1, a second cell string 21'-1 may be disposed in the second layer 21-2 different from the first layer 21-1, and a k-th cell string $2k'$-1 may be disposed in the k-th layer 21-k different from the second layer 21-2 so that the first through k-th cell strings 20'-1, 21'-1, and $2k'$-1 are disposed in three dimensions.

The first cell string 20'-1 in the first layer 21-1 may include a plurality of non-volatile memory cells (e.g., NAND flash memory cells) connected in series between a plurality of selection transistors ST11 and ST21. The second cell string 21'-1 in the second layer 21-2 may include a plurality of non-volatile memory cells (e.g., NAND flash memory cells) connected in series between a plurality of selection transistors ST12 and ST22. The k-th cell string $2k'$-1 in the k-th layer 21-k may include a plurality of non-volatile memory cells (e.g., NAND flash memory cells) connected in series between a plurality of selection transistors ST1k and ST2k.

A row decoder 240' illustrated in FIG. 3 may provide selection signals (e.g., a read voltage during a read operation, a power supply voltage during a program operation and 0 V during an erase operation) to string selection lines SSL1, SSL2, . . . , and SSLk connected to the gates of the first selection transistors ST11, ST12, . . . , and ST1k, respectively, implemented in the layers 21-1 through 21-k, respectively. The first selection transistors ST11-ST1k may be selectively turned on or off. The row decoder 240' may also provide selection signals (e.g., the read voltage during the read operation and 0 V during the program operation and the erase operation) to ground selection lines GSL1, GSL2, . . . , and GSLk connected to the gates of the second selection transistors ST21, ST22, . . . , and ST2k, respectively, implemented in the layers 21-1 through 21-k, respectively. The second selection transistors ST21 through ST2k may be selectively turned on or off. Each of the cell strings 20'-1 through $2k'$-m implemented in the respective layers 21-1 through 21-k may be selected by the row decoder 240'.

As illustrated in FIG. 3, the cell strings 20'-1 through $2k'$-1 may share with one another a plurality of word lines WL1-WLn, a common source line CSL and a bit line BL1. Cell strings at corresponding positions in the respective layers 21-1 through 21-k may be connected to a corresponding one among the page buffers 71-1 through 71-m included in a write driver/SA circuit 250'.

Figure 4A:
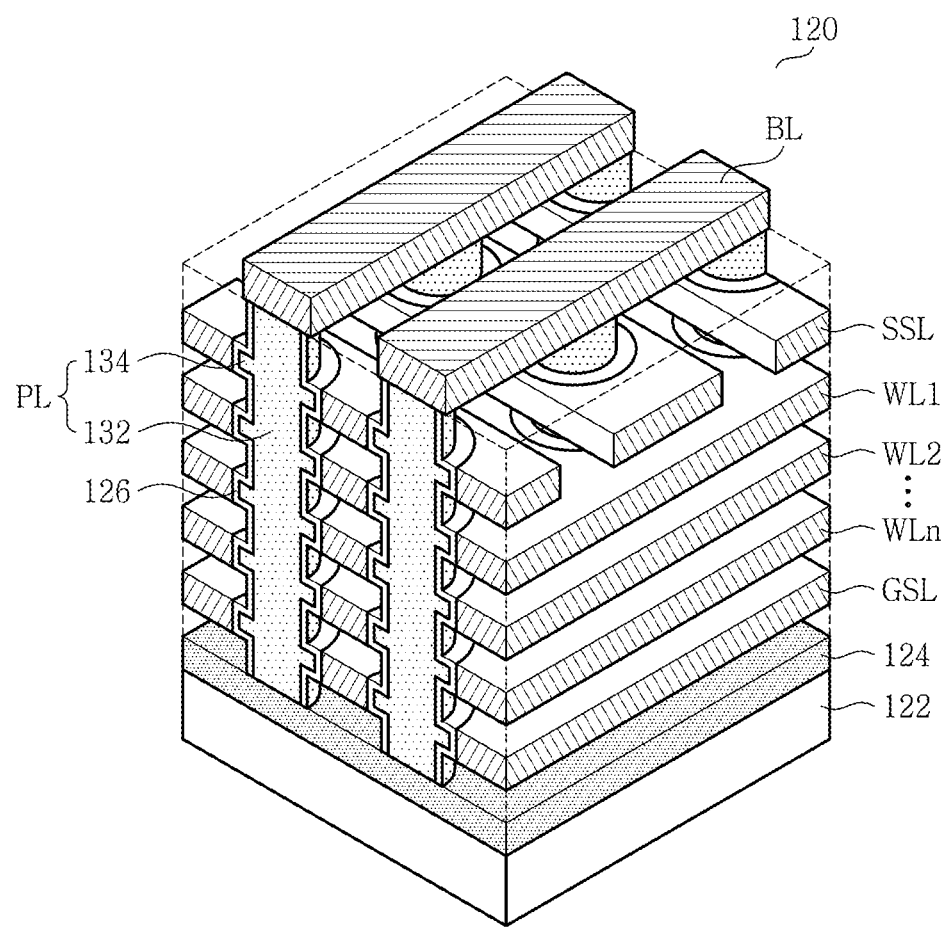
FIG. 4A is a perspective view of a non-volatile memory device according to at least one example embodiment of the inventive concepts.
Figure 4B:
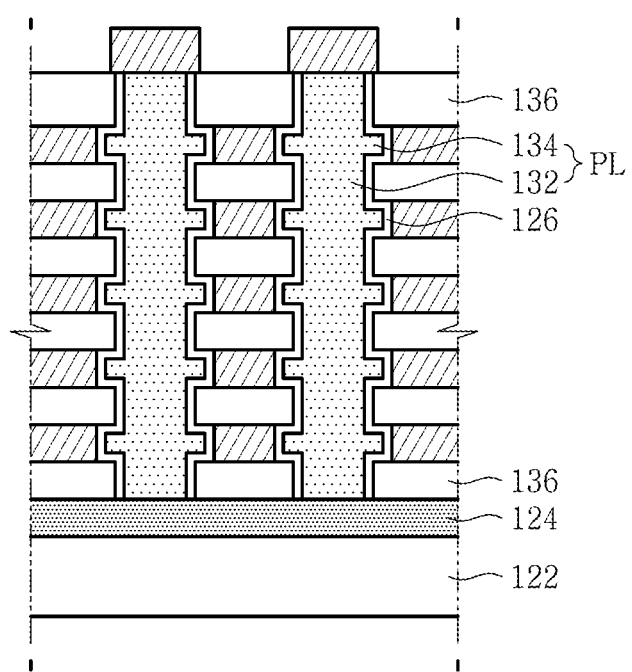
FIG. 4B is a cross-sectional diagram of the non-volatile memory device illustrated in FIG. 4A.

FIG. 4A is a perspective view of a non-volatile memory device 120 according to at least one example embodiment of the inventive concepts. FIG. 4B is a cross-sectional diagram of the non-volatile memory device 120 illustrated in FIG. 4A. Referring to FIGS. 4A and 4B, gate interlayer insulating layers 136 and conductive layers GSL, WL1-WLn, and SSL may be alternately and repeatedly stacked on a semiconductor substrate 122. A well region 124 may be on the semiconductor substrate 122 and may be a common source line CSL. The well region 124 may include, for example, an n+ conductivity type region. The gate interlayer insulating layers 136 and the conductive layers GSL, WL1-WLn, and SSL may be alternately stacked on the well region 124. The conductive layers GSL, WL1-WLn, and SSL may be sequentially stacked in order of GSL, WLn-WL1, and SSL. The gate interlayer insulating layers 136 may include an insulating material (e.g., a silicon oxide layer and/or a silicon nitride layer).

Among the stacked conductive layers GSL, WL1-WLn, and SSL, the top and bottom layers SSL and GSL may be used as a string selection line and ground selection line and the remaining conductive layers WL1-WLn may be used as word lines. The word lines WL1-WLn may include a conductive material (e.g., poly silicon and/or metal). A plurality of active pillars PL may pierce through the gate interlayer insulating layers 136 and the conductive layers GSL, WL1-WLn, and SSL. The active pillars PL may include, for example, a semiconductor material and may correspond to cell strings in a non-volatile memory device 120. The channels of selection transistors and memory cell transistors in each string may be electrically connected through the active pillars PL. The active pillars PL may be separated from one another, and may be electrically connected to the well region 124 on the semiconductor substrate 122 by piercing through the conductive layers GSL, WL1-WLn, and SSL.

The active pillars PL may protrude toward the conductive layers GSL, WL1-WLn, and SSL at each of the conductive layers GSL, WL1-WLn, and SSL. Each of the active pillars PL may include a body 132 extending vertically from the top of the semiconductor substrate 122 and a plurality of protrusions 134 which may extend from the body 132 toward the conductive layers GSL, WL1-WLn, and SSL and may be separated from one another. At each of the conductive layers GSL, WL1-WLn, and SSL, a protrusion 134 may face a corresponding one of the conductive layers GSL, WL1-WLn, and SSL, surrounding the body 132.

On the active pillars PL may be formed bit lines BL electrically connected to the active pillars PL. Each of the bit lines BL may cross string selection lines SSL and may be electrically connected to active pillars PL in one row and/or column among the active pillars PL. A channel may be formed at each of the protrusions 134 during operation of the non-volatile memory device 120. A charge storage layer pattern 126 may be between the protrusions 134 of each active pillar PL and the side walls of the conductive layers GSL, WL1-WLn, and SSL. The charge storage layer pattern 126 may contact the conductive layers GSL, WL1-WLn, and SSL and may cover the surface of the protrusions 134 and the body 132 of each active pillar PL. A pattern of the charge storage layer pattern 126 may be a ribbed pattern and may reduce interference between cells compared to a straight line shaped charge storage layer pattern.

When a three-dimensional (3D) non-volatile memory device is of a structure illustrated in FIGS. 4A and 4B, address scheduling methods according to example embodiments may be used for the 3D non-volatile memory device. Program performance may increase.

Figure 5A:
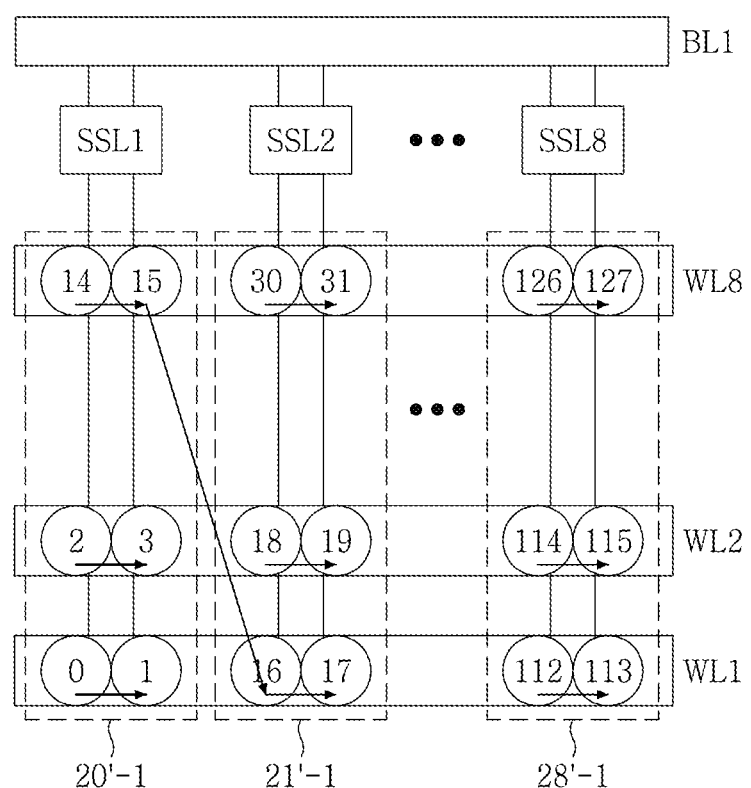
FIGS. 5A and 5B are diagrams illustrating address scheduling methods for a 3D non-volatile memory device according to at least one example embodiment of the inventive concepts.
Figure 5B:
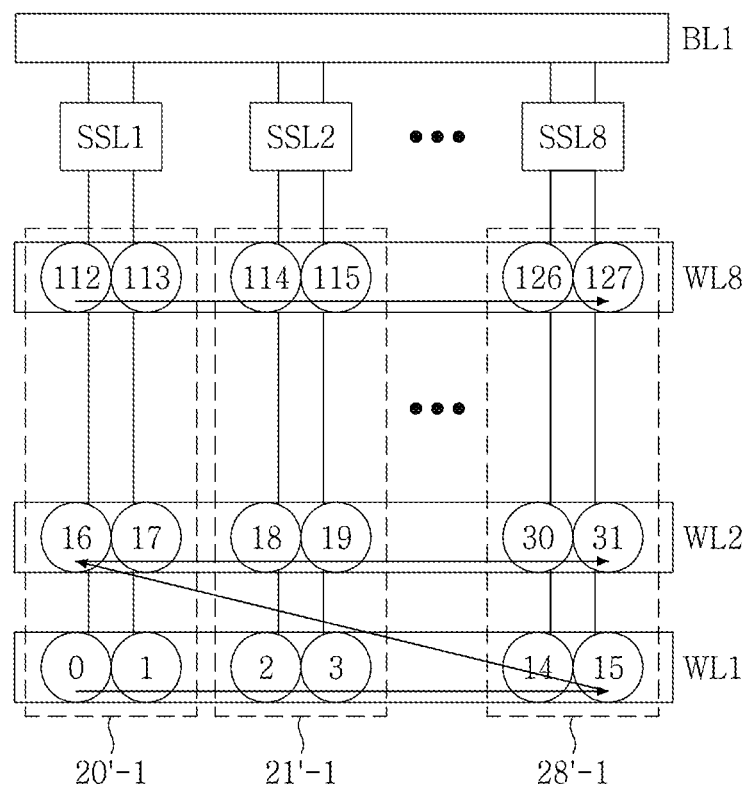

FIGS. 5A and 5B are block diagrams illustrating address scheduling methods for a 3D non-volatile memory device according to at least one example embodiment of the inventive concepts. FIGS. 5A and 5B may illustrate string selection lines SSL1-SSLk, bit line BL1 and word lines WL1-WLn illustrated in FIG. 3. Each of the word lines WL1-WLn may be connected to a plurality of MLCs. Each of the MLCs may include N pages to program N bits where N may be 2 or a natural number greater than 2. For example, when each MLC may store two bits, the MLC may include two pages. Example embodiments may be explained with reference to an MLC that may store two bits, but example embodiments of the inventive concepts may not be restricted thereto.

Referring to FIG. 5A, a first string selection line SSL1 connected to a bit line BL1 may be selected and bottom to top word lines WL1-WLn may be sequentially selected. In a program operation, after all pages (e.g., first and second pages) of an MLC connected to the first string selection line SSL1 at the bottom word line WL1 are programmed, all pages of an MLC connected to the first string selection line SSL1 at the next word line WL2 adjacent to the bottom word line WL1 may be programmed. All pages may be sequentially programmed up to the top word line WLn. Address scheduling of the second string selection line SSL2 may be performed (e.g., after the address scheduling of the first string selection line SSL1 may be completed) in the same manner. Address scheduling may be performed through to the last (e.g., the k-th) string selection line SSLk. When there may be 8 word lines WL1-WL8 and 8 string selection lines SSL1-SSL8 with 8 strings 20'-1 to 28'-1, as shown in FIG. 5A, the address scheduling may be performed as illustrated for 0-127 numbered in the arrow-headed direction illustrated in FIG. 5A.

Referring to FIG. 5B, addresses may be scheduled sequentially from the bottom word line WL1 to the top word line WLn with respect to the bit line BL1. Differently from the address scheduling method illustrated in FIG. 5A, the address scheduling illustrated in FIG. 5B may select one of the word lines WL1-WLn first and sequentially select the first to the k-th string selection lines SSL1-SSLk with respect to the selected word line. For example, pages (e.g., first and second pages) of all MLCs connected to the bottom word line WL1 may be sequentially programmed from the first string selection line SSL1 to the k-th string selection line SSLk. After the address scheduling of the bottom word line WL1 may be completed, all pages of the next word line WL2 may be programmed in the same manner. All pages may be sequentially programmed up to the top word line WLn. When there may be 8 word lines WL1-WL8 and 8 string selection lines SSL1-SSL8 as shown in FIG. 5B, the address scheduling may be performed as shown for 0-127 numbered in the arrow-headed direction illustrated in FIG. 5B.

When the address scheduling methods illustrated in FIGS. 5A and 5B are used, a program operation may be carried out by only applying a bias voltage one time to each of word lines instead of sequentially and alternately applying the bias voltage to the word lines, and the speed of the program operation may be increased.

Figure 5C:
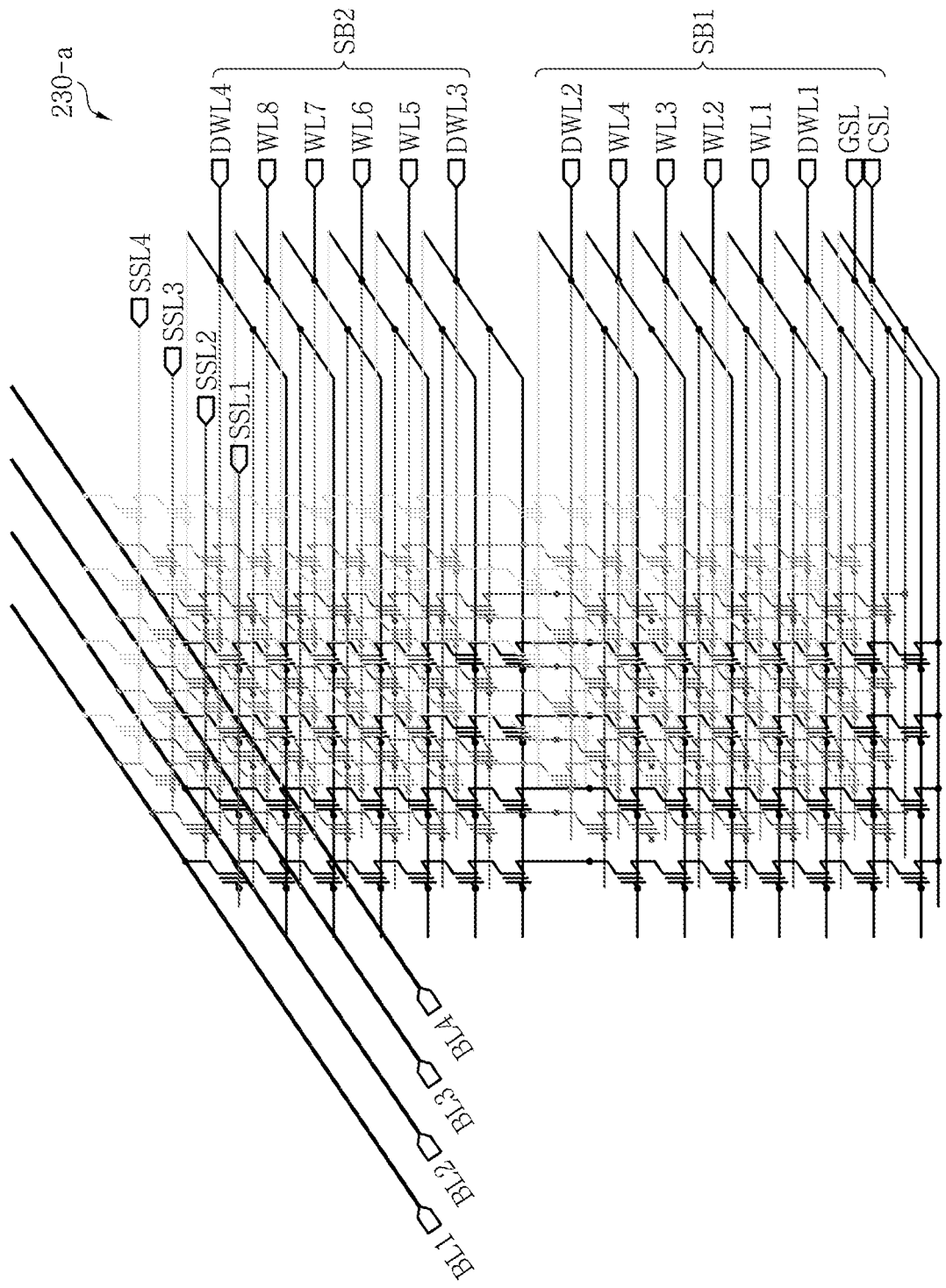
FIGS. 5C and 5D are diagrams illustrating a 3D non-volatile memory device having a sub-block structure according to at least one example embodiment of the inventive concepts.
Figure 5D:
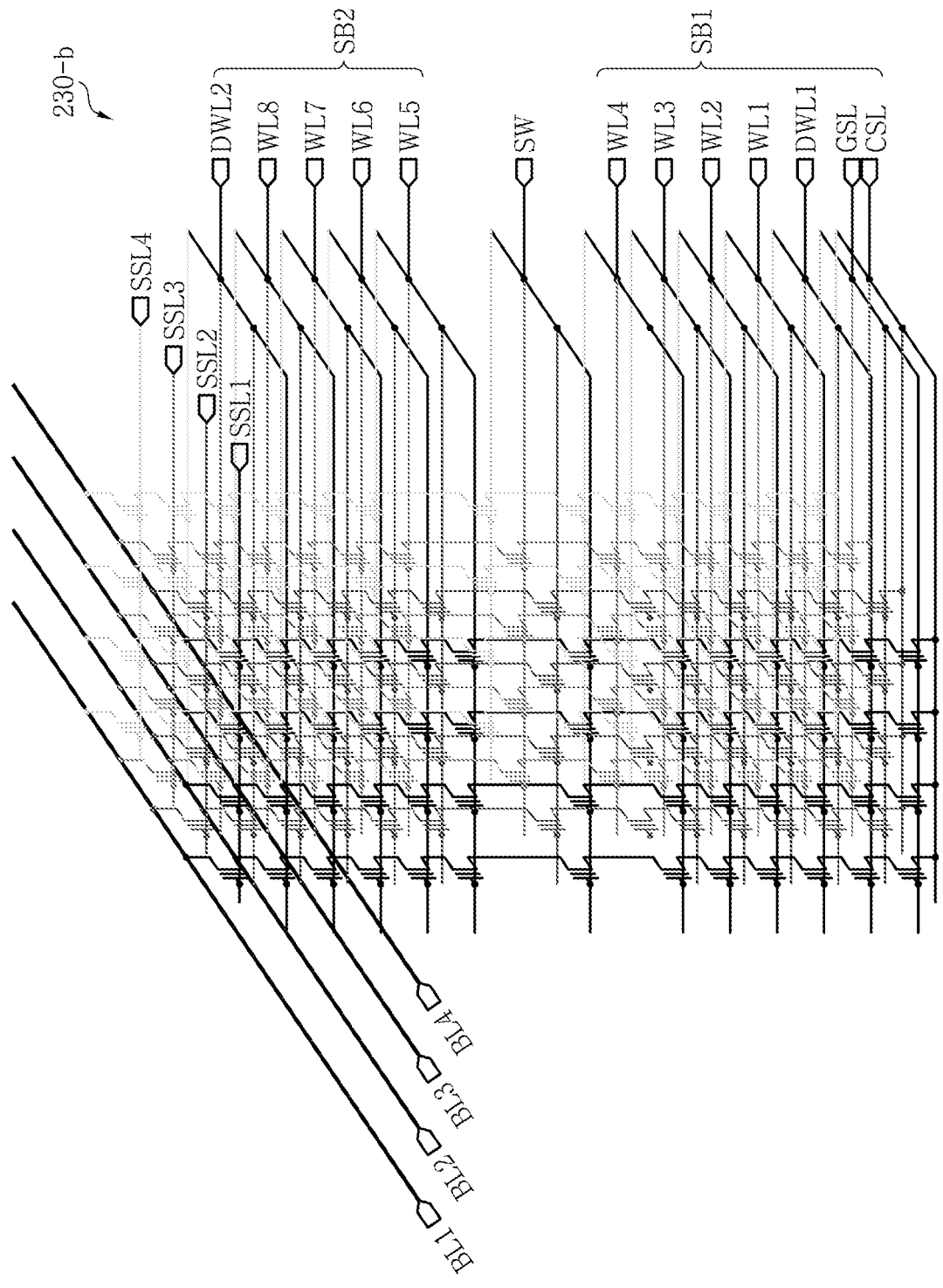
Figure 5E:
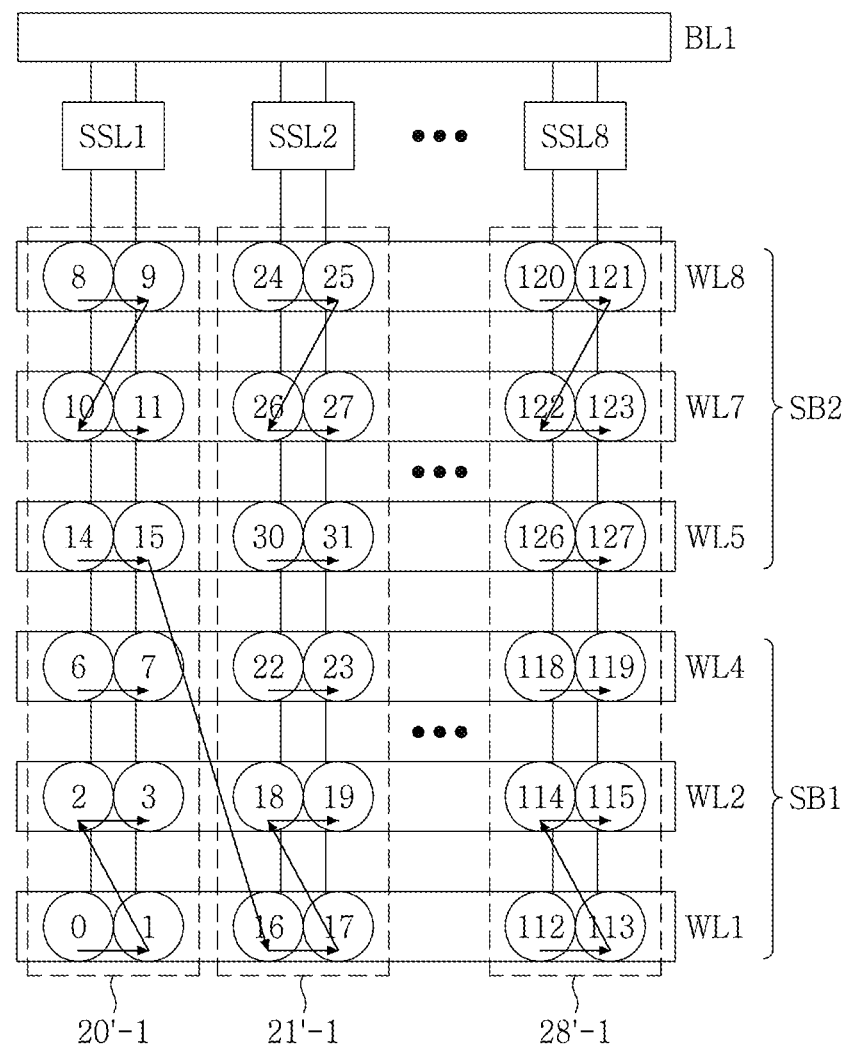
FIGS. 5E through 5G are diagrams illustrating an address scheduling method for a 3D non-volatile memory device having a sub-block structure according to at least one example embodiment of the inventive concepts.
Figure 5F:
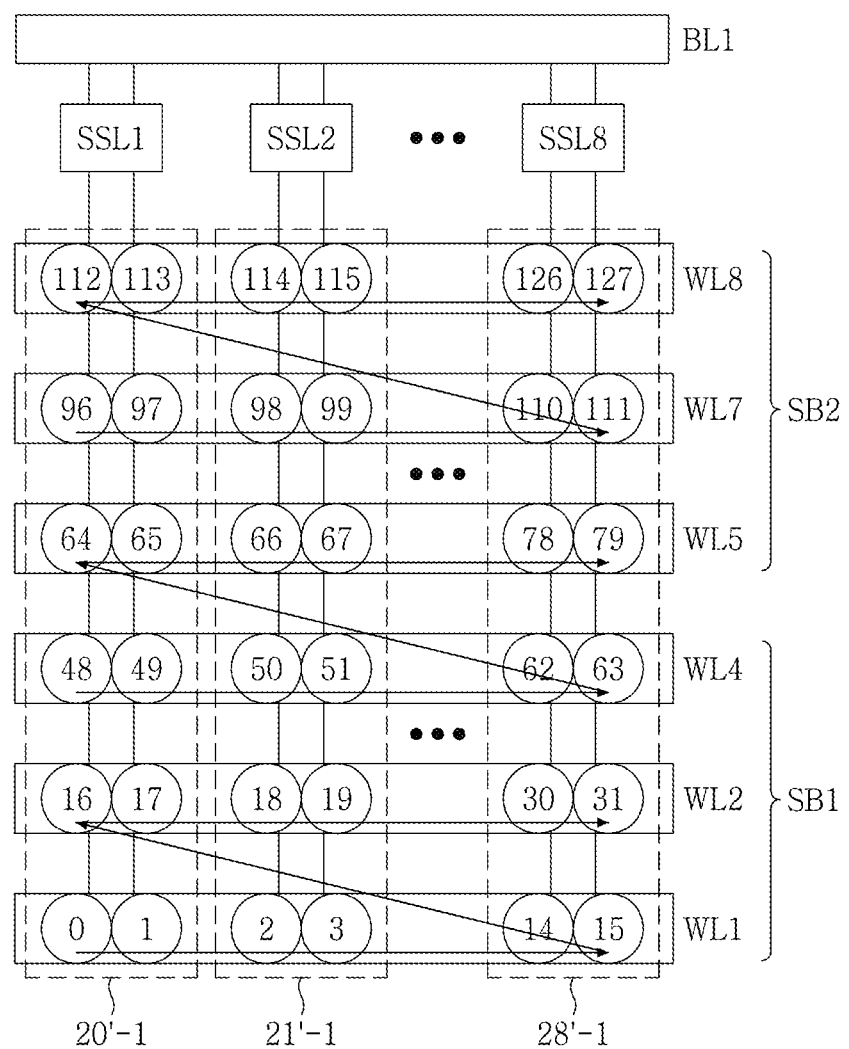
Figure 5G:
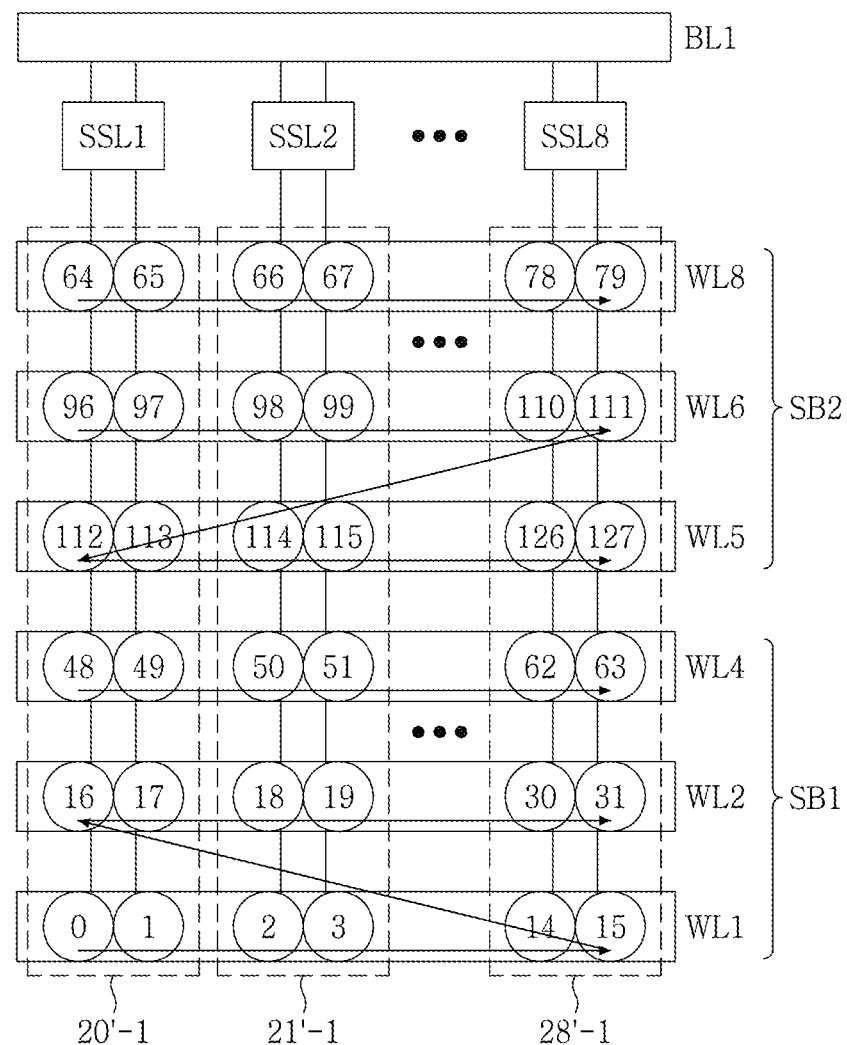

FIGS. 5C and 5D are diagrams illustrating a 3D non-volatile memory device having a sub-block structure according to at least one example embodiment of the inventive concepts. FIGS. 5E through 5G are diagrams illustrating an address scheduling method for a 3D non-volatile memory device having a sub-block structure according to at least one example embodiment of the inventive concepts.

For convenience of description, in the embodiments of the inventive concepts, it is assumed that a memory cell array has two sub-blocks, that is, first and second sub-blocks, and that the sub-blocks have the same size and the number of word lines belonging to each sub-block is 4. However, the memory cell array may have three or more sub-blocks, wherein the sub-blocks may have the same size, or at least one of the sub-blocks may have a size different from that of at least one remaining sub-block. Further, the number of word lines in each sub-block may be, but is not limited to, 4, and may change.

Furthermore, although the number of bit lines is illustrated as being 4 and the number k of string selection lines is also illustrated as being 4 in the embodiments of FIGS. 5C and 5D, and the number k of string selection lines is illustrated as being 8 in the embodiments of FIGS. 5E through 5F, these values are merely exemplary and embodiments of the inventive concepts are not limited thereto.

Referring to FIG. 5C, a cell array 230-a of the 3D non-volatile memory device may include two or more sub-blocks. The sub-blocks may be addressed independently of each other. The sub-blocks may therefore be operated independently from each other.

The cell array 230-a of the 3D non-volatile memory device includes a plurality of strings (that is, cell strings), each including a plurality of non-volatile memory cells that are connected in series.

The configuration of the cell array 230-a of the 3D non-volatile memory device in FIG. 5C is similar to that of the cell array 230' of the 3D non-volatile memory device illustrated in FIG. 3, except that the memory cell array is divided into two or more sub-blocks. Thus, a description will be made based on the difference between the cell arrays so as to avoid duplication of the detailed description.

The cell array 230-a of the 3D non-volatile memory device illustrated in FIG. 5C may include first and second sub-blocks SB1 and SB2 which are divided by one or more dummy word lines.

For example, memory cells connected to first and second dummy word lines DWL1 and DWL2 and memory cells connected to word lines WL1 through WL4 between the first and second dummy word lines DWL1 and DWL2 may belong to the first sub-block SB1, and memory cells connected to third and fourth dummy word lines DWL3 and DWL4 and memory cells connected to word lines WL5 through WL8 between the third and fourth dummy word lines DWL3 and DWL4 may belong to the second sub-block SB2.

Therefore, among memory cells in each string, the memory cells connected to the word lines WL1 through WL4 may belong to the first sub-block SB1, and the memory cells connected to the word lines WL5 through WL8 may belong to the second sub-block SB2.

That is, each string of the cell array 230-a of the 3D non-volatile memory device in FIG. 5C may further include at least one dummy memory cell connected between a memory cell belonging to the first sub-block SB1 and a memory cell belonging to the second sub-block SB2 so as to separate the first sub-block SB1 from the second sub-block SB2. The dummy memory cell may have the same type and specification as other memory cells.

Referring to FIG. 5D, a cell array 230-b of the 3D non-volatile memory device may include first and second sub-blocks SB1 and SB2 which are divided by switches. One or more switches may be coupled between the first sub-block SB1 and the second sub-block SB2. For example, switches for separating the first sub-block SB1 from the second sub-block SB1 may be inserted into each string, and each switch may be implemented as a transistor that is operated in response to a switch control signal SW.

In an embodiment of FIG. 5D, memory cells, connected to word lines WL1 through WL4 disposed on one side of the switch, may belong to the first sub-block, and memory cells, connected to word lines WL5 through WL8 disposed on the other side of the switch, may belong to the second sub-block.

However, a scheme for dividing two or more sub-blocks in the 3D non-volatile memory device is not limited to the embodiments of FIGS. 5C and 5D.

For example, in the embodiments of FIGS. 5C and 5D, the first and second sub-blocks share string selection lines SSL1, SSL2, SSL3, and SSL4 with each other, but, in other embodiments, the string selection lines SSL1, SSL2, SSL3, and SSL4 may be separated for each of the first and second sub-blocks. That is, separately from the string selection lines SSL1, SSL2, SSL3, and SSL4 for the first sub-block, string selection lines SSL1, SSL2, SSL3, and SSL4 for the second sub-block may be provided. Further, according to some embodiments, bit lines BL1, BL2, BL3, and BL4 may be connected between the first sub-block and the second sub-block.

Referring to FIG. 5E through FIG. 5G, when there may be 2 sub-blocks, 8 word lines WL1-WL8 and 8 string selection lines SSL1-SSL8 with 8 cell strings 20'-1 to 28'-1, as shown in FIG. 5E through FIG. 5G, the address scheduling may be performed as illustrated for 0-127 numbered in the arrow-headed direction illustrated in FIG. 5E through FIG. 5G.

In FIG. 5E through FIG. 5G, 20'-1 may be a cell string connected to the bit line BL1 and the string selection line SSL1 in FIGS. 5C and 5D, 21'-1 may be a cell string connected to the bit line BL1 and the string selection line SSL2 in FIGS. 5C and 5D, and 28'-1 may be a cell string connected to the bit line BL1 and the string selection line SSL8 in FIGS. 5C and 5D.

Referring to FIG. 5E, address scheduling on the first sub-block may be performed in the same manner as address scheduling illustrated in FIG. 5A, and address scheduling on the second sub-block may be performed in a manner different from that of address scheduling (e.g., in a different order) on the first sub-block.

For example, after the first bit line BL1 is selected and the first string selection line SSL1 connected to the first bit line BL1 is selected, address scheduling may be performed on multi-level cells connected to respective word lines sequentially in order from the bottom word line WL1 to the top word line WL4, which belong to the first sub-block SB1 of the first string. Thereafter, address scheduling may be performed on multi-level cells connected to respective word lines sequentially in order from the top word line WL8 to the bottom word line WL5, which belong to the second sub-block SB2.

For example, when a program operation is performed, all pages (e.g., a first page and a second page) of the bottom word line WL1 of the first sub-bock SB1 in the first string are programmed, and thereafter all pages of a subsequent word line WL2 adjacent to the bottom word line are programmed. By way of this procedure, all pages may be programmed sequentially from the bottom word line WL1 to the top word line WL4 of the first sub-block. Next, after all pages (e.g., the first page and the second page) of the top word line WL8 of the second sub-block SB2 in the first string are programmed, all pages of a subsequent word line WL7 adjacent to the top word line are programmed. By way of this procedure, all pages may be programmed sequentially from the top word line WL8 to the bottom word line WL5 of the second sub-block SB2. Two or more memory cells connected to same word line may be programmed concurrently.

After address scheduling of the first string is performed, address scheduling of the second string connected to the first bit line may be performed in the same manner as the address scheduling of the first string. For example, after address scheduling is sequentially performed from the bottom word line WL1 to the top word line WL4 of the first sub-block SB1 in the second string, address scheduling may be sequentially performed from the top word line WL8 to the bottom word line WL5 of the second sub-block SB2.

Referring to FIG. 5F, address scheduling on the first sub-block SB1 is performed in the same manner as address scheduling illustrated in FIG. 5B, and address scheduling on the second sub-block SB2 may be performed in the same manner as the address scheduling on the first sub-block SB1 (e.g., in the same order). For example, the first bit line BL1 is selected, so that address scheduling is performed on multi-level cells connected to the first word line WL1 of the first sub-block SB1 sequentially in order from the first string to the k-th string (where "k" is a natural number of 2 or more) which are connected to the first bit line BL1. Next, address scheduling is performed on multi-level cells, connected to the second word line WL2 adjacent to the first word line WL1 of the first sub-block SB1, sequentially from the first string to the k-th string (where "k" is a natural number of 2 or more) which are connected to the first bit line BL1. By way of this method, after address scheduling is completed on the last word line WL4 of the first sub-block SB1 in order from the first string to the k-th string (where "k" is a natural number of 2 or more) which are connected to the first bit line BL1, address scheduling on the second sub-block SB2 may be performed.

Address scheduling on the second sub-block SB2 may be performed in the same manner (e.g., in the same order) as address scheduling on the first sub-block SB1, as illustrated in FIG. 5F.

However, in some embodiments, unlike FIG. 5F, address scheduling on the second sub-block SB2 may be performed in a manner (e.g., in a different order) different from that of address scheduling on the first sub-block SB1.

For example, as shown in FIG. 5G, address scheduling may be performed on the second sub-block SB2 in order from the top word line WL8 to the bottom word line WL5.

Although, in the embodiments of FIGS. 5C and 5D, the first word line WL1 is the bottom word line, and the eighth word line WL8 is the top word line, the first word line WL1 may be the top word line, and the eighth word line WL8 may be the bottom word line in other embodiments.

Figure 6A:
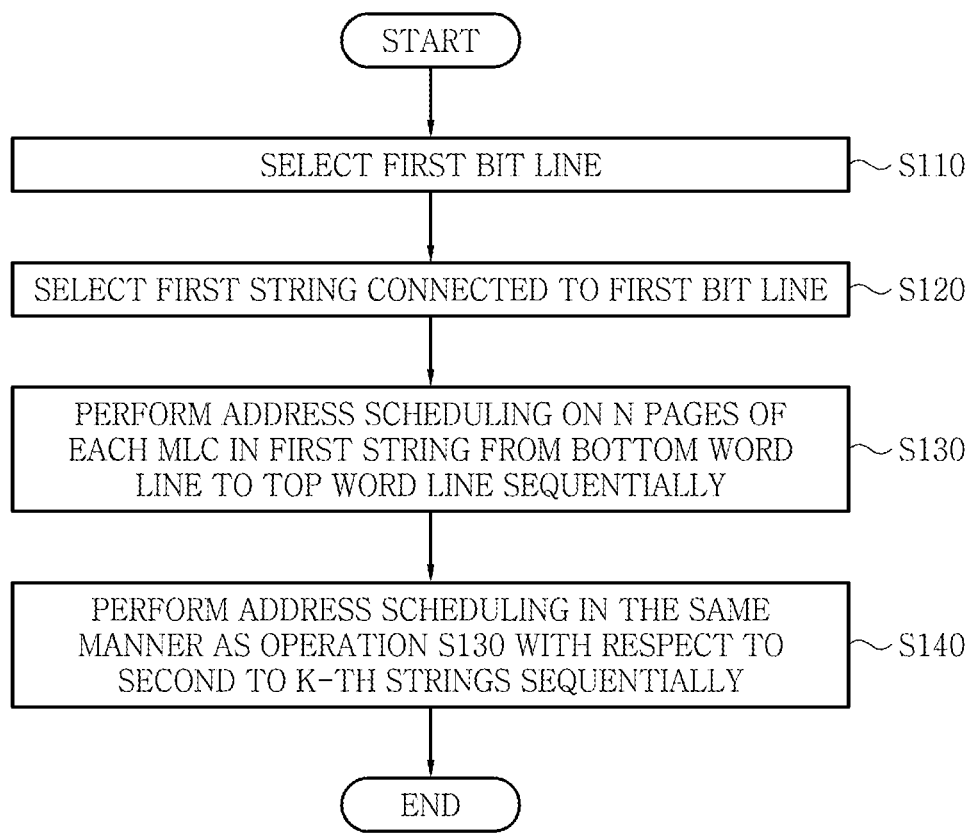
FIGS. 6A through 6D are flowcharts of the address scheduling methods illustrated in FIGS. 5A, 5B and 5E through 5G.
Figure 6B:
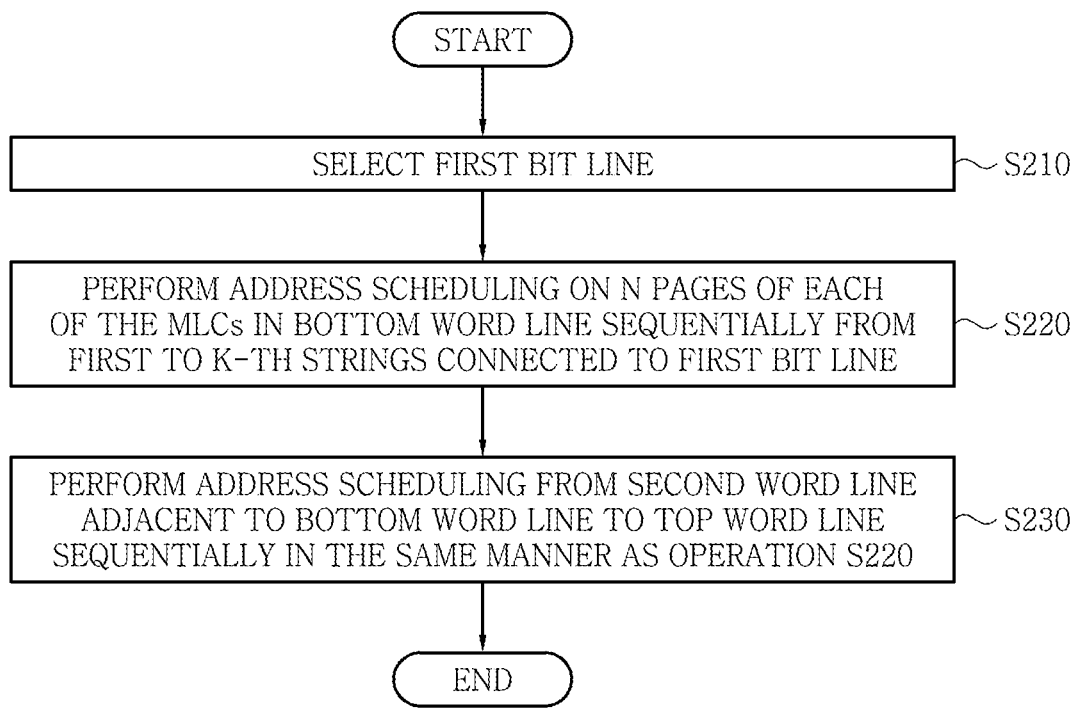

FIGS. 6A and 6B are flowcharts of the address scheduling methods illustrated in FIGS. 5A and 5B, respectively. Referring to FIG. 6A, a first bit line may be selected in operation S110. A first string connected to the first bit line may be selected in operation S120. Address scheduling may be performed on N pages of each MLC in the first string sequentially from a bottom word line to a top word line in operation S130. Address scheduling may be performed in the same manner as operation S130 with respect to second to k-th strings sequentially (e.g., after the address scheduling of the pages of all word lines in the first string may be completed) in operation S140 where "k" may be 2 or a natural number greater than 2. After address scheduling of the pages of all MLCs connected to the first bit line may be completed, another bit line may be selected and operations S120-S140 may be performed.

Referring to FIG. 6B, a first bit line may be selected in operation S210. Address scheduling may be performed on N pages of each of the MLCs in a bottom word line sequentially from first to k-th strings connected to the first bit line in operation S220 where "k" may be 2 or a natural number greater than 2. Address scheduling may be performed from a second word line adjacent to the bottom word line to a top word line (e.g., after the address scheduling on the bottom word line may be completed) sequentially in the same manner as operation S220 in operation S230. After address scheduling of the pages of all MLCs connected to the first bit line are completed, another bit line may be selected and operations S220 and S230 may be performed.

Figure 6C:
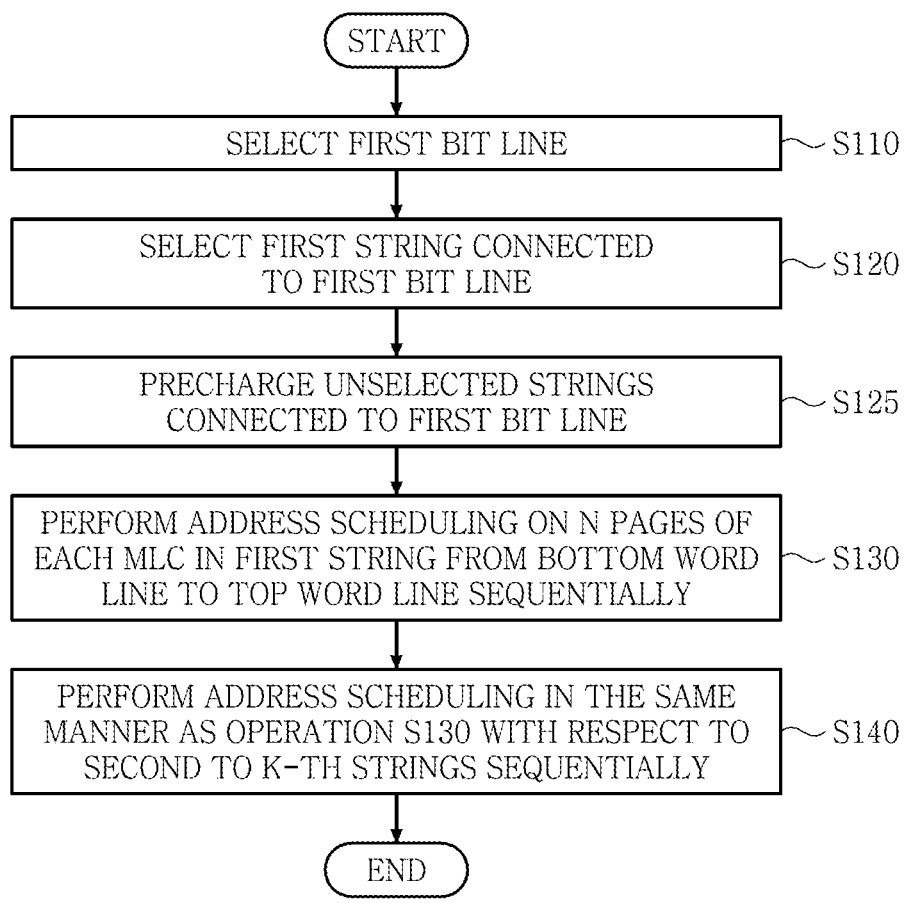

FIG. 6C is a flowchart illustrating an address scheduling method for a 3D non-volatile memory device according to other embodiments of the inventive concepts.

Referring to FIG. 6C, the address scheduling method for the 3D non-volatile memory device illustrated in FIG. 6C is similar to the address scheduling method for the 3D non-volatile memory device, illustrated in FIG. 6A, and thus a description will be made based on the difference between the address scheduling methods so as to avoid duplication of the detailed description.

The address scheduling method for the 3D non-volatile memory device, illustrated in FIG. 6C, may further include operation S125 of performing a precharge operation on unselected strings in a program operation or for a program operation.

The precharge operation on the unselected strings may be performed so as to increase a channel boosting level of the unselected strings.

The unselected strings to be precharged may be strings which share bit lines with a selected string and which are connected to different string selection lines SSL.

For example, when a first string is selected and programmed from among a plurality of strings connected to a first bit line, all or some of strings except the first string may be unselected strings.

Therefore, the first string connected to the first bit line may be selected in operation S120, and a precharge operation may be performed on at least one of the unselected strings in operation S125. Next, memory cells connected to the first string may be programmed through address scheduling of the first string, which is the selected string, in operation S130.

After address scheduling of the first string is completed, address scheduling for a program operation may be sequentially performed with respect to second to k-th strings in operation S140. Even in a program operation on each of the second to k-th strings, a precharge operation may be performed first on unselected strings in the same manner as the program operation on the first string.

For example, when a second string is selected from among a plurality of strings connected to the first bit line and is then programmed, a precharge operation may be performed on at least one string other than the second string, and thereafter memory cells connected to the second string may be programmed through address scheduling of the second string in operation S140.

The precharge operation on the unselected strings may be performed in response to a preset precharge condition. The precharge condition may include, for example, the magnitude of a precharge voltage to be applied, a time during which the precharge voltage is applied, etc.

For example, the 3D non-volatile memory device according to an embodiment of the inventive concepts may adjust the magnitude and application time of a precharge voltage to be applied to a bit line BL and/or a common source line CSL connected to an unselected string in response to the preset precharge condition.

In an embodiment of FIG. 6C, the operation S125 of performing a precharge operation on the unselected cell strings is performed between operations S120 and S130, but is not limited thereto. In some embodiments, the order of respective operations illustrated in FIG. 6C may differ, and two or more of the operations may be performed in parallel.

Figure 6D:
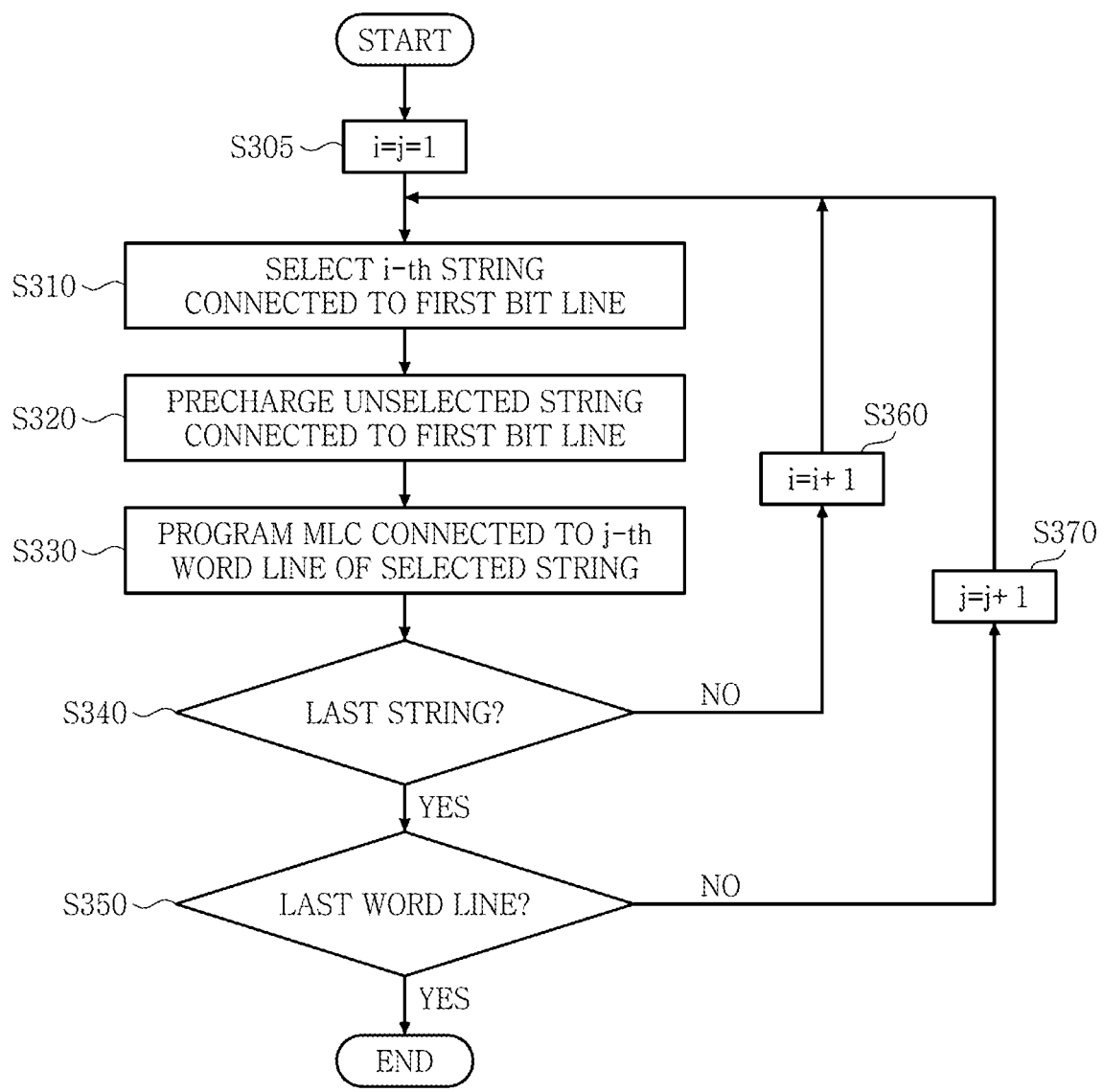

FIG. 6D is a flowchart illustrating a program method for a 3D non-volatile memory device according to other embodiments of the inventive concepts. In detail, the program method for the 3D non-volatile memory device, illustrated in FIG. 6D, may be correspond to flowchart illustrating in detail a part of the address scheduling method illustrated in FIG. 5B or 5F or may correspond to a part of the address scheduling method for the 3D non-volatile memory device, illustrated in FIG. 6B.

The program method for the 3D non-volatile memory device, illustrated in FIG. 6D, may include performing a precharge operation on unselected strings in a program operation or for a program operation.

Referring to FIG. 6D, parameters i and j, indicating a string and a word line, may be respectively initialized (e.g., to "1") in operation S305.

With respect to a first word line (j=1) connected to a first bit line, a first string (i=1) may be selected in operation S310, and at least one unselected string may be precharged in operation S320. Thereafter, multi-level cells connected to the first word line (j=1) of the selected string (e.g., the first string) may be programmed in operation S330. Here, the at least one unselected string may be at least one string other than the first string, among a plurality of strings connected to the first bit line.

In this way, a single string may be selected sequentially from a second string to a k-th string (where "k" is a natural number of 2 or more) in operation S310 while i is gradually increased by 1 with respect to the first word line (j=1) in operation S360. After at least one unselected string has been precharged in operation S320, multi-level cells connected to the first word line (j=1) of the selected string may be programmed in operation S330. Operations S310 to S330 may be repeatedly performed up to the last string.

If the programming of the first word line is completed, the word line is increased by 1 (j=j+1) in operation S370, and a program operation may be performed on a second word line in the same manner as the first word line.

By means of this method, the program operation may be performed up to the last word line.

In the embodiment of FIG. 6D, the first word line may be a bottom word line or a top word line, among a plurality of word lines connected to a first string through a k-th string. Further, in the embodiment of FIG. 6D, the operation S320 of performing a precharge operation on the unselected strings is performed between operations S310 and S330, but operation 320 is not limited thereto. In some embodiments, the order of the operations in FIG. 6D may differ, and two or more operations may be performed in parallel.

Figure 7:
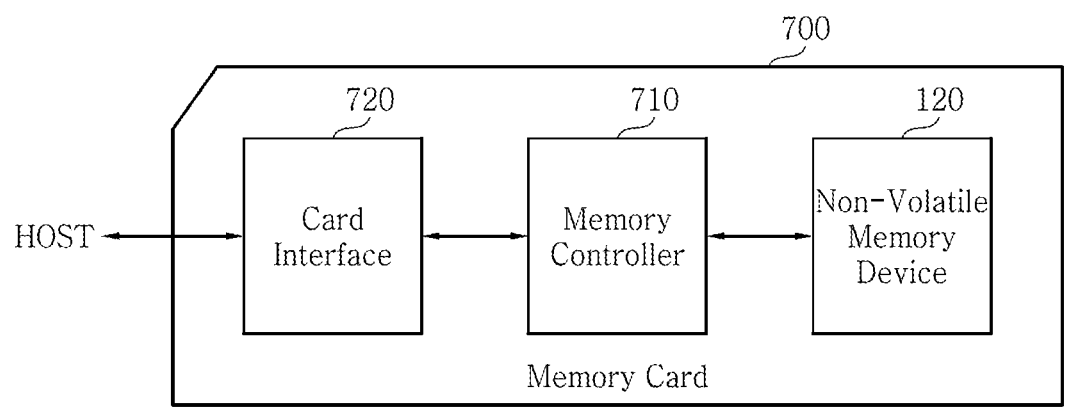

FIG. 7 is a block diagram of memory systems 700 including non-volatile memory devices 120 illustrated in FIG. 1 according to at least one example embodiment of the inventive concepts. A memory system 700 illustrated in FIG. 7 may be, for example, a flash memory card including a non-volatile memory device 120 controlling operating time according to an operating voltage applied to a selected word line, a memory controller 710 and a card interface 720. The memory controller 710 may control data exchange between the non-volatile memory device 120 and the card interface 720.

A memory system 700 may be a smart card. The card interface 720 may be a secure digital (SD) card interface and/or a multi-media card (MMC) interface, but example embodiments are not limited thereto. The card interface 720 may control data exchange between a host HOST and the memory controller 710 according to the type of the host HOST. When a memory system 700 is connected to a host (e.g., a computer, a digital camera, a digital audio player, a cellular phone, a console video game hardware, and/or a digital set-top box) the memory controller 710 of the memory system 700 and a controller included in the host HOST may transmit and receive data stored in the non-volatile memory device 120.

Figure 8:
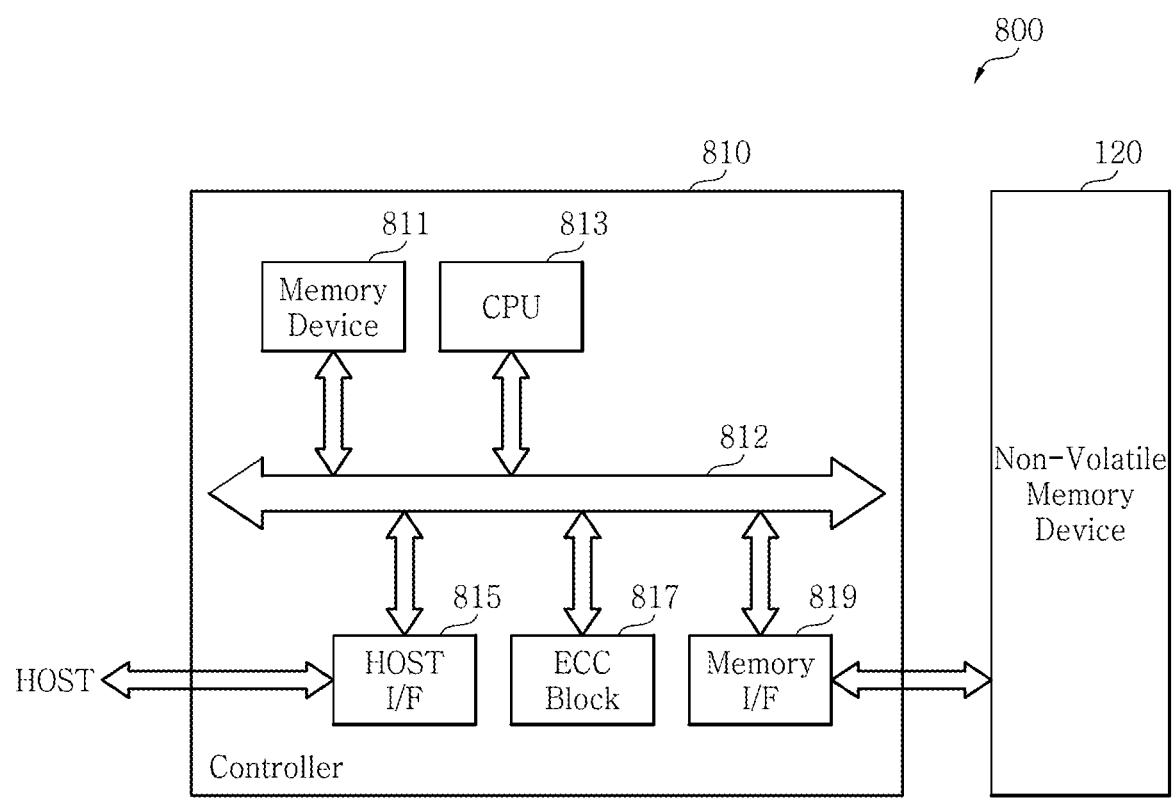

FIG. 8 is a block diagram of memory systems 800 including non-volatile memory devices 120 illustrated in FIG. 1 according to other example embodiments of the inventive concepts. Referring to FIG. 8, a memory system 800 may be a flash memory apparatus and may include a non-volatile memory device 120 controlling operating time according to an operating voltage applied to a selected word line, and a memory controller 810 controlling the operation of the non-volatile memory device 120. The memory controller 810 may include a memory device 811 that may be used as an operation memory for a central processing unit (CPU) 813. The memory device 811 may include dynamic random access memory (DRAM) and/or a static RAM (SRAM).

A host interface 815 may transfer data between a host HOST connected to the memory system 800 and the memory controller 810 according to the protocol of the host HOST. An error correction code (ECC) block 817 may detect and correct errors in data read from the non-volatile memory device 120. A memory interface 819 may transfer data between the non-volatile memory device 120 and the memory controller 810. The CPU 813 may control data exchange among the memory device 811, the host interface 815, the ECC block 817, and the memory interface 819 through a bus 812. The memory system 800 may be, for example, a universal serial bus (USB) flash drive and/or a memory stick.

Figure 9:
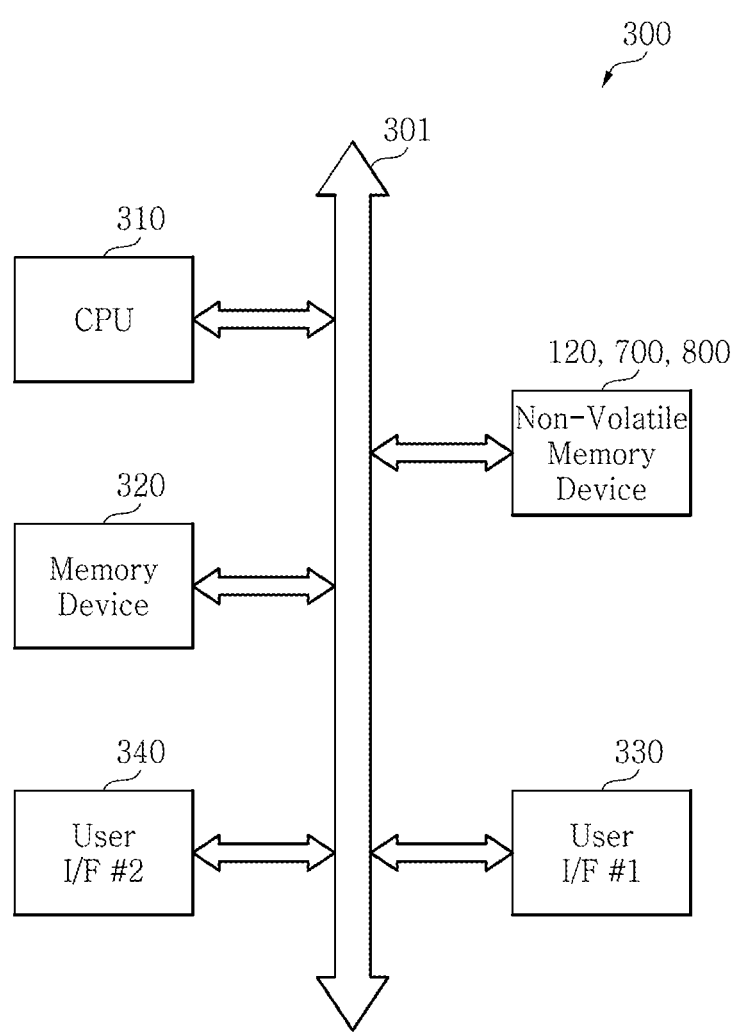

FIG. 9 is a block diagram of memory systems 300 including non-volatile memory devices 120 illustrated in FIG. 1 according to further example embodiments of the inventive concepts. Referring to FIG. 9, a memory system 300 may be, for example, a cellular phone, a smart phone, a personal digital assistant (PDA), a digital camera, a portable game console, an MP3 player, a high-definition television (HDTV), a global positioning system (GPS), a navigator, consumer equipment (CE), a digital set-top box, and/or an information technology (IT) device. The memory system 300 may include a CPU 310 and at least one non-volatile memory device 120 which may be connected to each other through a bus 301. The memory system 300 may include the CPU 310 and the memory system 700 and/or 800 illustrated in FIG. 7 or 8, which may be connected to each other through the bus 301.

The CPU 310 may control the operations (e.g., program, read and erase operations) and/or data transmission to a host of a non-volatile memory device 120 and/or a memory system 700 and/or 800. A memory device 320 connected to the bus 301 may be used as an operation memory for the CPU 310. The memory device 320 may include DRAM and/or SRAM. The memory device 320 may be a memory module (e.g., a single inline memory module (SIMM) and/or a dual inline memory module (DIMM)) including a plurality of non-volatile memory devices 120 illustrated in FIG. 1.

The memory system 300 may include a first user interface 330, for example, a display and/or a touch pad. The memory system 300 may include a second user interface 340 such as an I/O interface. The second user interface 340 may be an output device, or example, a printer and/or an input device (e.g., a keyboard and/or a mouse). The first user interface 330 may be replaced by, for example, a complementary metal-oxide semiconductor (CMOS) image sensor. The CMOS image sensor may be controlled by the CPU 310 to convert an optical image into a digital image and store the digital image in the non-volatile memory device 120 and/or the memory system 700 and/or 800.

Figure 10:
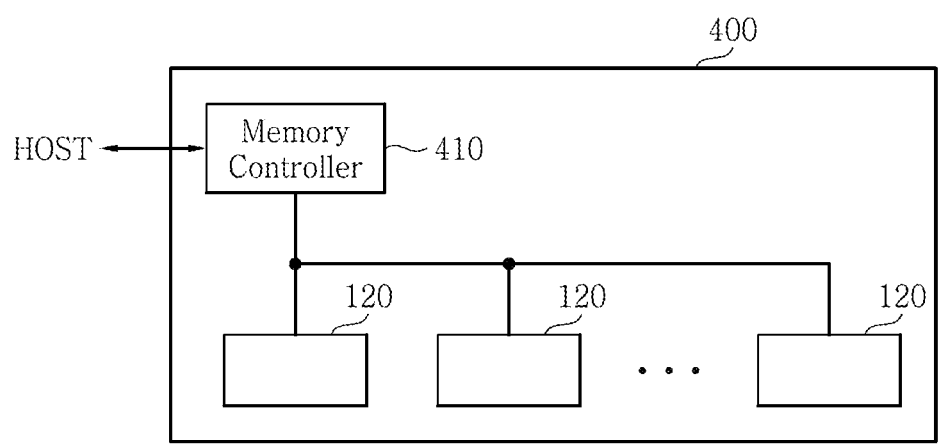

FIG. 10 is a block diagram of memory systems 400 including non-volatile memory devices 120 illustrated in FIG. 1 according to yet other example embodiments of the inventive concepts. Referring to FIG. 10, a memory system 400 may be or may include a solid state drive (SSD). The memory system 400 may include a plurality of non-volatile memory devices 120 and a memory controller 410 controlling the operation of the non-volatile memory devices 120. Each of the non-volatile memory devices 120 may adaptively control operating time for determining and/or verifying whether a selected memory cell among a plurality of non-volatile memory cells in each non-volatile memory device 120 has been programmed and/or erased in compliance with the memory controller 410. The memory controller 410 may communicate with a host HOST.

Figure 11:
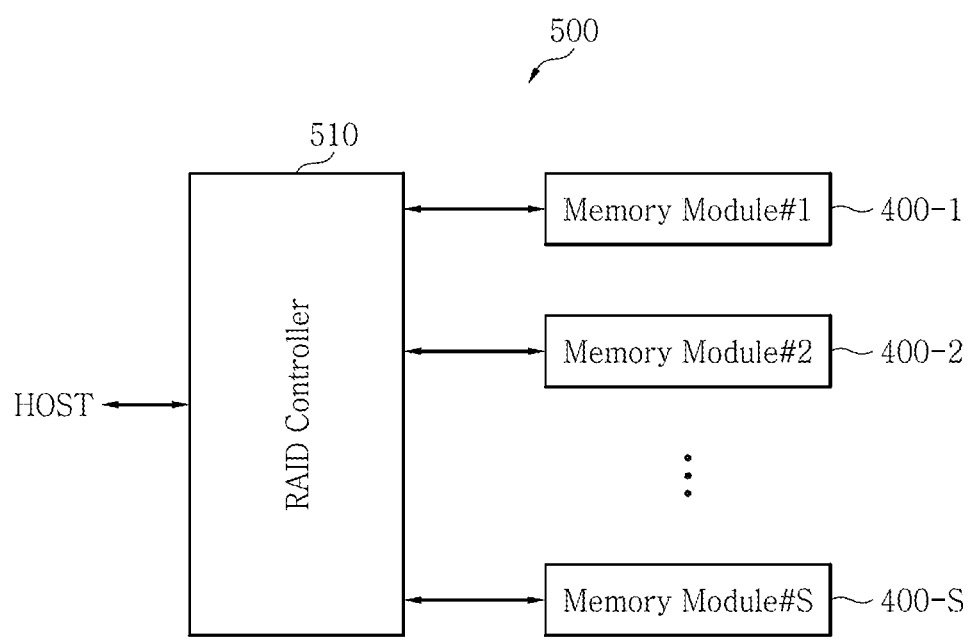

FIG. 11 is a block diagram data storage apparatuses 500 including memory systems 400 illustrated in FIG. 10. Referring to FIGS. 10 and 11, the data storage apparatus 500 may be a redundant array of independent disks (RAID) system and include a RAID controller 510 and a plurality of memory modules 400-1 through 400-S where "S" is a natural number. Each of the memory modules 400-1 through 400-S may be a memory system 400 illustrated in FIG. 10. The memory modules 400-1 through 400-S may be part of a RAID array. The data storage apparatus 500 may be or may include a personal computer (PC) and/or an SSD.

A data storage apparatus 500 which may be implemented by a redundant array of independent disks (RAID) system may include a plurality of memory modules and a RAID controller 510. The plurality of memory modules may form a redundant array of independent disks (RAID) array. Each of the memory modules 400-1 through 400-S may include a plurality of the non-volatile memory devices 120 and a memory controller 410 that may control the operation of the non-volatile memory devices 120. The RAID controller 510 may control the operation of the memory modules 400-1 through 400-S.

In a write and/or program operation, the RAID controller 510 may output write and/or program data received from a host to one of the memory modules 400-1 through 400-S according to one RAID level selected from among a plurality of RAID levels based on RAID level information in response to a write and/or program command received from the host HOST. In a read operation, the RAID controller 510 may output to the host data read from one of the modules 400-1 through 400-S according to one RAID level selected from among a plurality of RAID levels based on RAID level information in response to a read command received from the host.

As described above, according to at least one example embodiment of the inventive concepts, address scheduling methods for a 3D memory cell array may increase the operating performance of a memory device. Example embodiments of the inventive concepts may be embodied as hardware, software or combination thereof. Example embodiments of the inventive concepts may be embodied as computer-readable codes on a computer-readable medium. The computer-readable recording medium may be any data storage device that can store data as a program which can be thereafter read by a computer system. Examples of the computer-readable recording medium may include read-only memory (ROM), random-access memory (RAM), CD-ROMs, magnetic tapes, floppy disks, and/or optical data storage devices. The computer-readable recording medium can also be distributed over network coupled computer systems so that the computer-readable code is stored and executed in a distributed fashion.

While example embodiments have been particularly shown and described, it will be understood by one of ordinary skill in the art that variations in form and detail may be made therein without departing from the spirit and scope of the claims.

What is claimed is:

1. An address scheduling method of a three dimensional nonvolatile memory device including a first sub-block, a second sub-block, and a plurality of cell strings, the first sub-block including a first plurality of word lines and nonvolatile memory cells coupled to the first plurality of word lines, the second sub-block including a second plurality of word lines and nonvolatile memory cells coupled to the second plurality of word lines, each of the plurality of cell strings including a plurality of multi-bit memory cells from among the nonvolatile memory cells of the first sub-block and a plurality of multi-bit memory cells from among the nonvolatile memory cells of the second sub-block, each multi-bit memory cell being a memory cell that is configured to store N-bit data, where "N" is a natural number greater than or equal to 2, the method comprising:
    selecting a first bit line connected to first through k-th strings from among the plurality of cell strings, where "k" is a natural number greater than or equal to 2;
    selecting the first string coupled to the first bit line;
    performing, sequentially, addressing scheduling on the memory cells of the first string that are included in the first sub-block, in order from a bottom word line of the first plurality of word lines to a top word line of the first plurality of word lines; and
    performing, sequentially, addressing scheduling on the memory cells of the first string that are included in the second sub-block, in order from a bottom word line of the second plurality of word lines to a top word line of the second plurality of word lines.

2. The method of claim 1, further comprising:
    selecting the second string coupled to the first bit line;
    performing, sequentially, addressing scheduling on the memory cells of the second string that are included in the first sub-block, in order from a bottom word line of the first plurality of word lines to a top word line of the first plurality of word lines; and
    performing, sequentially, addressing scheduling on the memory cells of the second string that are included in the second sub-block, in order from a bottom word line of the second plurality of word lines to a top word line of the second plurality of word lines.

3. The method of claim 1, wherein the plurality of cell strings further comprises:
    at least one switch or at least one dummy memory cell connected between a memory cell belonging to the first sub-block and a memory cell belonging to the second sub-block, for separating the first sub-block from the second sub-block.

4. The method of claim 1, further comprising:
    performing a precharge operation on at least one string excluding the first string among the plurality of cell strings connected to the first bit line.

5. The method of claim 4, wherein the precharge operation is performed in response to a preset precharge condition.

6. The method of claim 1, wherein N is 2 or N is 3.

7. An address scheduling method of a three dimensional nonvolatile memory device including a plurality of cell strings, each of the plurality of cell strings including a plurality of nonvolatile multi-bit memory cells belonging to a first sub-block and a plurality of nonvolatile multi-bit memory cells belonging to a second sub-block, each nonvolatile multi-bit memory cell being a memory cell that is configured to store N-bit data, where "N" is a natural number greater than or equal to 2, the method comprising:
    selecting a first bit line connected to first through k-th strings, from among the plurality of cell strings, where "k" is a natural number greater than or equal to 2;
    performing, sequentially, addressing scheduling on memory cells connected to a first word line of the first sub-block, in order from the first string to the k-th string;
    performing, sequentially, addressing scheduling on memory cells connected to a second word line adjacent to the first word line of the first sub-block, in order from the first string to the k-th string; and
    after performing address scheduling for a last word line of the first sub-block in order from the first string to the k-th string, performing, sequentially, addressing scheduling on memory cells connected to a first word line of the second sub-block, in order from the first string to the k-th string.

8. The method of claim 7, further comprising:
    performing addressing scheduling on memory cells connected to a second word line adjacent to the first word line of the second sub-block in order from the first string to the k-th string.

9. The method of claim 8, wherein
    the first word line of the first sub-block is a bottom word line of word lines belonging to the first sub-block,
    the last word line of the first sub-block is a top word line of word lines belonging to the first sub-block, and
    the first word line of the second sub-block is a bottom word line of word lines belonging to the second sub-block.

10. The method of claim 7, wherein
    the first word line of the first sub-block is a bottom word line of word lines belonging to the first sub-block,
    the last word line of the first sub-block is a top word line of word lines belonging to the first sub-block, and
    the first word line of the second sub-block is a top word line of word lines belonging to the second sub-block.

11. The method of claim 7, wherein the performing addressing scheduling on the memory cells connected to the first word line of the first sub-block comprises:
- selecting the first string;
- performing a precharge operation on at least one string excluding the first string among the first through k-th strings connected to the first bit line; and
- programming the memory cells included in the first string and connected to the first word line of the first sub-block.

12. The method of claim 11, wherein the precharge operation is performed in response to a preset precharge condition.

* * * * *